US010217745B2

(12) United States Patent
Ando et al.

(10) Patent No.: US 10,217,745 B2
(45) Date of Patent: *Feb. 26, 2019

(54) HIGH-K GATE DIELECTRIC AND METAL GATE CONDUCTOR STACK FOR FIN-TYPE FIELD EFFECT TRANSISTORS FORMED ON TYPE III-V SEMICONDUCTOR MATERIAL AND SILICON GERMANIUM SEMICONDUCTOR MATERIAL

(71) Applicant: INTERNATIONAL BUSINESS MACHINES CORPORATION, Armonk, NY (US)

(72) Inventors: Takashi Ando, Tuckahoe, NY (US); Martin M. Frank, Dobbs Ferry, NY (US); Pranita Kerber, Mount Kisco, NY (US); Vijay Narayanan, New York, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/959,832

(22) Filed: Apr. 23, 2018

(65) Prior Publication Data
US 2018/0240799 A1 Aug. 23, 2018

Related U.S. Application Data

(60) Continuation of application No. 15/492,463, filed on Apr. 20, 2017, now Pat. No. 10,002,871, which is a
(Continued)

(51) Int. Cl.
H01L 27/092 (2006.01)
H01L 29/66 (2006.01)
(Continued)

(52) U.S. Cl.
CPC .... H01L 27/0924 (2013.01); H01L 21/28255 (2013.01); H01L 21/28264 (2013.01);
(Continued)

(58) Field of Classification Search
CPC ......... H01L 27/0924; H01L 21/823821; H01L 21/823828; H01L 21/823857;
(Continued)

(56) References Cited

U.S. PATENT DOCUMENTS 7,432,567 B2   10/2008   Doris et al.
7,863,126 B2    1/2011   Park et al.
(Continued)

FOREIGN PATENT DOCUMENTS

WO   2013/101007 A1   7/2013

OTHER PUBLICATIONS

List of IBM Patents or Patent Applications Treated as Related dated Apr. 23, 2018, 2 pages.
(Continued)

Primary Examiner — Cuong Q Nguyen
Assistant Examiner — Tong-Ho Kim
(74) Attorney, Agent, or Firm — Tutunjian & Bitetto, P.C.; Vazken Alexanian

(57) ABSTRACT

An electrical device that includes at least one n-type field effect transistor including a channel region in a type III-V semiconductor device, and at least one p-type field effect transistor including a channel region in a germanium containing semiconductor material. Each of the n-type and p-type semiconductor devices may include gate structures composed of material layers including work function adjusting materials selections, such as metal and doped dielectric layers. The field effect transistors may be composed of fin
(Continued)

type field effect transistors. The field effect transistors may be formed using gate first processing or gate last processing.

20 Claims, 8 Drawing Sheets

Related U.S. Application Data division of application No. 14/828,202, filed on Aug. 17, 2015, now Pat. No. 9,859,279.

(51) Int. Cl.
*H01L 29/78* (2006.01)
*H01L 29/51* (2006.01)
*H01L 21/8238* (2006.01)
*H01L 29/49* (2006.01)
*H01L 21/8258* (2006.01)
*H01L 21/28* (2006.01)

(52) U.S. Cl.
CPC .. *H01L 21/8258* (2013.01); *H01L 21/823821* (2013.01); *H01L 21/823828* (2013.01); *H01L 21/823857* (2013.01); *H01L 29/495* (2013.01); *H01L 29/4966* (2013.01); *H01L 29/517* (2013.01); *H01L 29/6681* (2013.01); *H01L 29/66522* (2013.01); *H01L 29/66545* (2013.01); *H01L 29/66795* (2013.01); *H01L 29/785* (2013.01); *H01L 29/513* (2013.01)

(58) Field of Classification Search
CPC ... H01L 29/495; H01L 29/513; H01L 29/517; H01L 29/66522; H01L 29/66545; H01L 29/66795; H01L 29/785
USPC .......................................... 257/369; 438/142
See application file for complete search history.

(56) References Cited

U.S. PATENT DOCUMENTS

| | | |
|---|---|---|
| 7,993,999 B2 | 8/2011 | Basker et al. |
| 8,294,180 B2 | 10/2012 | Doyle et al. |
| 8,354,309 B2 | 1/2013 | Green et al. |
| 8,466,473 B2 | 6/2013 | Cai et al. |
| 8,486,770 B1 | 7/2013 | Wu et al. |
| 8,828,818 B1 | 9/2014 | Rodder |
| 8,836,049 B2 | 9/2014 | Tsai et al. |
| 2006/0172480 A1 | 8/2006 | Wang et al. |
| 2013/0105906 A1 | 5/2013 | Yin et al. |
| 2013/0200454 A1 | 8/2013 | Anderson et al. |
| 2013/0228864 A1 | 9/2013 | Mieno |

OTHER PUBLICATIONS

L. Czornomaz et al., "Co-integration of InGaAs n- and SiGe p-MOSFETs into digital CMOS circuits using hybrid dual-channel ETXOI substrates," International Electron Devices Meeting (IEDM), Dec. 9-11, 2013, pp. 2.8.1-2.8.4.

X. Zhang et al., "A gate-last In0.53Ga0.47 As channel FinFET with Molybdenum source/drain contacts," European, Solid-State Device Research Conference, ESSDERC, Sep. 17-21, 2012, pp. 177-180.

T. Maeda et al., "Scalable TaN metal source/drain & gate InGaAs/ Ge n/pMOSFETs," 2011 Symposium on VLSI Technology Digest of Technical Papers, Jun. 2011, pp. 62-63.

M. Yokoyama et al., "CMOS integration of InGaAs nMOSFETs and Ge pMOSFETs with self-align Ni-based metal S/D using direct wafer bonding," 2011 Symposium on VLSI Technology Digest of Technical Papers, Jun. 2011, pp. 60-61.

S. Takagi et al., "High mobility material channel CMOS technologies based on heterogeneous integration," 11th International Workshop on Junction Technology (IWJT), Jun. 2011, pp. 1-6.

List of IBM Patents or Patent Applications Treated as Related.

HIGH-K GATE DIELECTRIC AND METAL GATE CONDUCTOR STACK FOR FIN-TYPE FIELD EFFECT TRANSISTORS FORMED ON TYPE III-V SEMICONDUCTOR MATERIAL AND SILICON GERMANIUM SEMICONDUCTOR MATERIAL

FIELD OF THE INVENTION

The present disclosure relates generally to semiconductor devices, and more particularly to work function modifications in semiconductor devices.

BACKGROUND

Field effect transistors (FETs) are widely used in the electronics industry for switching, amplification, filtering and other tasks related to both analog and digital electrical signals. Most common among these are metal oxide semiconductor field effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type (NMOS and PMOS) transistors are used to fabricate logic and circuitry.

Continuing trends in semiconductor device manufacturing include a reduction in electrical device feature size (scaling), as well as improvements in device performance in terms of device switching speed and power consumption. Some examples of methods to improve device switching include adjusting the work function of the materials in the gate structure.

SUMMARY

In one aspect of the present disclosure, an electrical device is provided that includes a finFET semiconductor devices formed on type IV semiconductor surfaces including germanium (Ge) and type III-V semiconductor surfaces, in which the finFETs are formed using gate first processing. In some embodiments, the electrical device may include a first fin structure of a type III-V semiconductor material and a second fin structure of a germanium containing semiconductor material. The channel region of an n-type FinFET may be present in the first fin structure. The n-type finFET may include a n-type work function gate structure including a first interface layer including a dopant of an aluminum containing composition at an interface of a channel region. The n-type work function gate structure may further include a first high-k dielectric layer on the interface layer, a first work function metal layer atop the first high-k dielectric layer and a first gate electrode atop the first high-k dielectric layer. The channel region of a p-type FinFET may be present in the second fin structure. The p-type finFET may include a p-type work function gate structure including a second interface layer including a dopant from group IIA elements, group IIIB elements or a combination therefore. The second interface layer is present at an interface of a channel region of the second fin structure and a second high-k dielectric of the p-type work function gate structure. The p-type work function gate structure may further include a second work function metal layer that is present on the second high-k dielectric layer, and second gate electrode atop the second high-k dielectric layer.

In some embodiments, the second gate electrode having a same composition as the first gate electrode.

In one embodiment, a silicon containing layer is present between the aluminum dopant layer of the n-type work function gate structure and the III-V semiconductor type material of the substrate, and a silicon containing layer is present between the p-type work function gate structure and the germanium containing semiconductor material of the substrate. In some embodiments, the silicon containing material may be conformally deposited on the fin structure, and in some embodiments may be composed of amorphous silicon (Si).

A method of forming an electrical device including finFETs using a gate first process is also provided by the present disclosure. In one embodiment, the method includes providing a substrate including a first fin structure of a type III-V semiconductor material and a second fin structure of a type IV germanium containing semiconductor material. A first dopant layer of an aluminum containing composition is formed on the first fin structure. A second dopant layer of group IIA elements, group IIIB elements or a combination thereof is formed on the second fin structure. A gate stack composed of a hafnium based gate dielectric, and a metal gate conductor is formed on the first fin structure and the second fin structure. The gate stack, the first dopant layer, and the second dopant layer is patterned to provide a first gate structure on the first fin structure and a second gate structure on the second fin structure. The n-type source and drain regions are formed on opposing sides of the first gate structure, and p-type source and drain regions are formed on opposing sides of the second gate structure.

In another aspect, an electrical device is provided including finFET semiconductor devices formed on type IV semiconductor surfaces including germanium (Ge) and type III-V semiconductor surfaces, in which the finFETs are formed using gate last processing (which may also be referred to as replacement metal gate (RMG) processing). In one embodiment, the electrical device may include a substrate including a first fin structure of a type III-V semiconductor material and a second fin structure of a germanium containing semiconductor material. The channel region of an n-type FinFET may be present in the first fin structure. The n-type finFET may include a n-type work function gate structure including a first high-k gate dielectric layer present on the channel region, a first metal work function adjusting layer of a titanium containing metal nitride layer, and a first gate electrode. The channel region of a p-type FinFET may be present in the second fin structure. The p-type finFET may include a p-type work function gate structure including an interface layer of a group IIA element, group IIIB element or a combination thereof. The interface layer is present at an interface of the channel region of the second fin structure and a second high-k dielectric layer. The p-type work function gate structure may also include a second metal work function adjusting layer including a stack of titanium and aluminum containing materials that is present atop the high-k gate dielectric atop the second high-k dielectric layer, and a second gate electrode atop the second high-k gate dielectric layer.

In some embodiments, a silicon containing layer is present between the aluminum dopant layer of the n-type work function gate structure and the III-V semiconductor type material of the substrate, and a silicon containing layer is present between the p-type work function gate structure and the germanium containing semiconductor material of the substrate. In some embodiments, the silicon containing material may be conformally deposited on the fin structure, and in some embodiments may be composed of amorphous silicon (Si). For devices processed using gate last processing of FinFETs, the silicon containing layer, i.e., interface layer, may be omitted from the fin structures that provide the n-type FinFETs.

A method of forming an electrical device including fin-FETs using a gate last process is also provided by the present disclosure. In one embodiment, the method includes providing a first fin structure of a type III-V semiconductor material and a second fin structure of a germanium containing semiconductor material. A first replacement gate structure is formed on the first fin structure, and a second replacement gate structure is formed on the second fin structure. N-type source and drain regions are formed in the first region of the substrate on opposing sides of the first gate structure. P-type source and drain regions are formed in the second region of the substrate on opposing sides of the second gate structure. The first replacement gate structure is substituted with a first functional gate structure including a high-k gate dielectric and a first gate conductor that produces a first oxygen vacancy concentration in the high-k gate dielectric. The second replacement gate structure is substituted with a second functional gate structure including the high-k gate dielectric and a second gate conductor that produces a second oxygen vacancy concentration in the high-k gate dielectric. The second oxygen vacancy concentration is greater than the first oxygen vacancy concentration. In some embodiments, gate processing in accordance with the gate last process for forming the FinFETs may include gate processing at temperatures greater than 400° C. For example, the gate electrode processing for the gate last process for forming the finFETs of the present disclosure may be <450° C.

DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Figure 1:
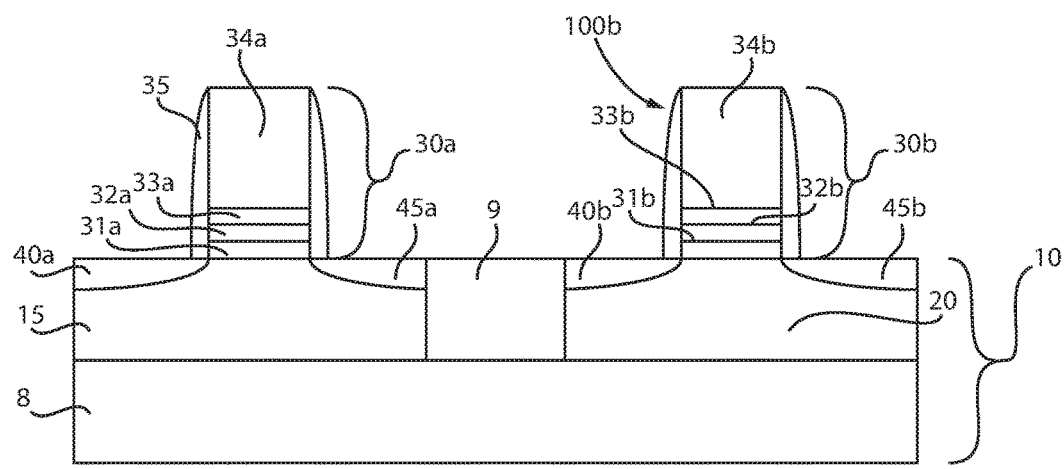
FIG. 1 is a side cross-sectional view depicting a planar n-type field effect transistor (FET) on a first portion of a substrate composed of a type III-V semiconductor material, and a planar p-type field effect transistor (FET) on a second portion of the substrate composed of a germanium containing material, in which the n-type and p-type field effect transistors include work function adjustments and are formed using gate first methods, in accordance with one embodiment of the present disclosure.

Detailed embodiments of the methods and structures of the present disclosure are described herein; however, it is to be understood that the disclosed embodiments are merely illustrative of the disclosed methods and structures that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The present disclosure is related to forming complementary metal oxide semiconductor (CMOS) devices, in which the p-type conductivity semiconductor devices, e.g., fin type field effect transistors (FinFETs), are formed on a silicon and germanium containing semiconductor surface, such as silicon germanium (SiGe), and the n-type conductivity semiconductor devices, e.g., fin type field effect transistors (FinFETs), are formed on a type III-V semiconductor surface, e.g., indium gallium arsenide (InGaAs), in which the gate structures of the n-type and p-type semiconductor devices have had work function adjustments. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. In the following description, the semiconductor device is a field effect transistor. Complementary metal oxide semiconductor (CMOS) is a type of semiconductor that use both N-type (negative polarity) and P-type (positive polarity) semiconductor circuits. Typically, since only one of the circuit types is on at any given time, CMOS chips require less power than chips using just one type of transistor. A "field effect transistor" is a transistor in which output current, i.e., source-drain current, is controlled by the voltage applied to a gate structure. A field effect transistor typically has three terminals, i.e., a gate structure, source region and drain region. As used herein, the term "source" is a doped region in the semiconductor device, in which majority carriers are flowing into the channel. As used herein, the term "channel" is the region underlying the gate structure and between the source and drain of a semiconductor device that becomes conductive when the semiconductor device is turned on. As used herein, the term "drain" means a doped region in semiconductor device located at the end of the channel, in which carriers are flowing out of the transistor through the drain. A "gate structure" means a structure used to control output current (i.e., flow of carriers in the channel) of a semiconducting device through electrical or magnetic fields.

A FinFET is a field effect transistor in which at least the channel portion of the field effect transistor is present in a fin structure. As used herein, a "fin structure" refers to a semiconductor material, which can be employed as the body of a semiconductor device, in which the gate structure is positioned around the fin structure such that charge flows down the channel on the two sidewalls of the fin structure and optionally along the top surface of the fin structure. The term "planar" as used to describe a semiconductor device orientation, e.g., planar FET, denotes that the direction of charge carriers from the source region to the drain region of the semiconductor device is along a plane that is parallel to the upper surface of the substrate, wherein a gate structure is present on the upper surface of the substrate. In a planar semiconductor device, the gate structure does not wrap around the sidewalls of the channel region as in a fin structure.

The term "work function" is used to describe a gate material that determines the threshold voltage of a semiconductor device. For example, a work function adjustment effectuates a threshold voltage shift either towards the valence band or conduction band. As used herein, "threshold voltage" is the lowest attainable gate voltage that will turn on a semiconductor device, e.g., transistor, by making the channel of the device conductive. A "valence band" is the highest range of electron energies where electrons are normally present at absolute zero. The "conduction band" is the lowest lying electron energy band of the doped material that is not completely filled with electrons.

It has been determined that III-V nFET/SiGe pFET CMOS devices can require specific work function engineering, i.e., work function adjustments, to enable the appropriate functioning of FinFET and planar FET devices due to the different affinities of type III-V semiconductors, such as indium gallium arsenide (InGaAs) and germanium containing semiconductors, such as silicon germanium (SiGe), in comparison to conventional silicon (Si) substrates, e.g., single crystalline-Si (c-Si).

In some embodiments, the methods and structures disclosed herein provide a single metal high-k metal gate stack to enable planar dual channel CMOS devices using III-V nFETs and SiGe pFETs (planar nFET and planar pFET). In some examples of CMOS arrangements including planar FETs, both the nFET and pFET gate stacks, require effective work functions (EWF) ranging from 4.4 to 4.6 eV for planar dual channel CMOS. The effective work function is defined relative to the vacuum level and extracted using measured C-V curves on silicon (Si), i.e., EWF of the gate stack is extracted from a CV curve of the gate stack deposited on silicon, and includes the work function of the electrode along with fixed charges and dipoles within the dielectric.

In some embodiments, the methods and structures disclosed herein provide a high-k metal gate stack to enable CMOS devices using FinFET semiconductor devices, in which the effective work function (EWF) of the p-type device is less than the n-type conductivity device. For example, n-type FinFETs require effective work functions (EWF) ranging from 4.7 to 4.8 eV (undoped channel). P-type FinFETs require effective work functions (EWF) ranging from 4.15 to 4.25 eV (undoped channel). The effective work function is defined relative to the vacuum level and extracted using measured C-V curves on silicon (Si), i.e., EWF of the gate stack is extracted from a CV curve of the gate stack deposited on silicon. Adjustments to the required work function may then be made based on InGAs and SiGe band offsets. In some embodiments, gate first processing and gate last processing, i.e., replacement gate processing, use a combination of dielectric doping and single metal/dual metal gate structure solutions. The work function adjustments for the FinFETs on type III-V semiconductor materials and germanium containing materials are opposite in polarity to what is practiced on silicon. The methods and structures of the present disclosure are now discussed with greater detail referring to FIGS. 1-15.

FIG. 1 depicts a planar n-type field effect transistor (FET) 100$a$ on a first portion 15 of a substrate 10 that is composed of a type III-V semiconductor material, and a planar p-type field effect transistor (FET) 100$b$ on a second portion 20 of the substrate 10 that is composed of a germanium containing material. The n-type and p-type field effect transistors 100$a$, 100$b$ each include work function adjustments and are formed using a gate first method. The first portion 15 of the substrate 10 may be separated from the second portion 20 of the substrate 10 by an isolation region 9, such as a shallow trench isolation (STI) regions, which in one example can be composed of silicon oxide ($SiO_2$).

The term "III-V semiconductor material" denotes a semiconductor material that includes at least one element from Group IIIB of the Periodic Table of Elements under the Old International Union of Pure and Applied Chemistry (IUPAC) classification system, or Group 13 of the New International Union of Pure and Applied Chemistry classification system; and at least one element from Group VB of the Periodic Table of Elements, or Group 15 of the New International Union of Pure and Applied Chemistry classification system. In some embodiments, the III-V semiconductor material that is present in the first portion 15 of the substrate may be selected from the group of (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof. The germanium containing material that provides the second portion 20 of the substrate 10 may be substantially 100 at. % germanium (Ge), e.g., greater than 95 at % germanium (Ge), such as 99 at. % germanium (Ge), silicon germanium (SiGe), silicon germanium doped with carbon (SiGe:C) or combinations thereof. It is noted that in one example, the III-V semiconductor material that provides the first portion 15 of the substrate 10 is $In_{0.53}Ga_{0.47}As$, and the germanium containing material that provides the second portion 20 of the substrate 10 is silicon germanium (SiGe) having greater than 50 at. % germanium. It is noted that the above atomic percent that are provide to describe the material of the first and second portions 15, 20 of the substrate describe a base material, i.e., intrinsic semiconductor, which does not include a measurement of the dopants that provided the conductivity type of the device, e.g., whether the FET is a p-type or n-type FET.

Each of the n-type and p-type field effect transistors 100$a$, 100$b$ include a gate structure having work function adjustments, which in some embodiments provides an effective work function ranging from 4.3 to 4.7 eV for each of the n-type and p-type field effect transistors 100$a$, 100$b$. The n-type field effect transistor 100$a$ may include a first gate structure 30$a$ that includes a first interface dielectric layer 31$a$ formed on the channel region of the first portion 15 of the substrate 10; a first high-k gate dielectric layer 32$a$ that is present on the first interface dielectric layer 31$a$; a first metal work function adjusting layer 33$a$ that is present on the first high-k gate dielectric layer 32$a$; and a first conductive electrode 34$a$. The p-type field effect transistor 100$b$ may include a second gate structure 30$b$ that includes a second interface dielectric layer 31$b$ formed on the channel region of the second portion 20 of the substrate 10; a second high-k gate dielectric layer 32$b$ that is present on the second interface dielectric layer 31$b$; a second metal work function adjusting layer 33$b$ that is present on the second high-k gate dielectric layer 32$b$; and a second conductive electrode 34$b$.

The first and second interface dielectric layer 31$a$, 31$b$ may be an oxide, such as silicon oxide ($SiO_2$). In some embodiments, the first and second interface dielectric layers 31$a$, 31$b$ may also be provided by a doped dielectric material. For example, the first and second interface dielectric layers 31$a$, 31$b$ may be comprised of a dopant selected from Group IIA or Group IIIB of the periodic table of elements under the Old International Union of Pure and Applied Chemistry (IUPAC) classification system. Examples of dielectric dopants may be selected from the group consisting of beryllium (Be), magnesium (Mg), barium (Ba), lanthanum (La), yttrium (Y) and combinations thereof. For example, at least one of the first and second interface dielectric layer 31$a$, 31$b$ may be composed of lanthanum oxide ($La_2O_3$). In some embodiments, only the second interface dielectric layer of the second gate stack to the p-type conductivity planar field effect transistor (FET) is composed of a doped dielectric including a dopant selected from Group IIA or Group IIIB of the periodic table of elements, such as lanthanum oxide ($La_2O_3$). The thickness for each of the first and second interface dielectric layer 31$a$, 31$b$ may range from 1 Å to 10 Å. In some examples, the thickness for each of the first and second interface dielectric layers 31a, 31b may be on the order of 2 Å to 6 Å.

The term "high-k" as used to describe the first and second high-k gate dielectric layers 32a, 32b denotes a dielectric material having a dielectric constant greater than silicon oxide ($SiO_2$) at room temperature (20° C. to 25° C.) and atmospheric pressure (1 atm). For example, a high-k dielectric material may have a dielectric constant greater than 4.0. In another example, the high-k gate dielectric material has a dielectric constant greater than 7.0. In some embodiments, the first and second high-k gate dielectric layers 32a, 32b are composed of a hafnium-based dielectric. The term 'Hf-based dielectric' is intended herein to include any high k dielectric containing hafnium (Hf). Examples of such Hf-based dielectrics comprise hafnium oxide ($HfO_2$), hafnium silicate (HfSiOx), Hf silicon oxynitride (HfSiON) or multilayers thereof. In some embodiments, the Hf-based dielectric comprises a mixture of $HfO_2$ and $ZrO_2$ or rare earth oxide such as $La_2O_3$. MgO or MgNO can also be used. Typically, the Hf-based dielectric is hafnium oxide or hafnium silicate. Hf-based dielectrics typically have a dielectric constant that is greater than about 10.0. In one embodiment, the thickness for each of the first and second high-k gate dielectric layers 32a, 32b is greater than 0.8 nm. More typically, the at least one first gate dielectric layer 13 has a thickness ranging from about 1.0 nm to about 6.0 nm.

The first and second gate structures 30a, 30b may be formed using a single metal electrode, i.e., first and second metal work function adjusting layer 33a, 33b and first and second conductive electrode 34a, 34b, for both of the first and second gate structures 30a, 30b. By single metal electrode it is meant that the composition for both the first and metal work function adjusting layers 33a, 33b, as well as the composition for both of the first and second gate electrode 34a, 34b, is the same. For example, the first and second metal work function adjusting layers 33a, 33b may each be composed of metal nitride, such as titanium nitride (TiN). In some examples, stoichiometry tuning of titanium nitride (TiN) may be used to for fine tuning the work function adjustments provided by the first and second metal work function adjusting layers 33a, 33b. Stoichiometric tuning can be accomplished by adjusting the titanium (Ti) to nitrogen (N) ratio during the physical vapor deposition (PVD) sputtering program for forming the material layer. Although titanium nitride (TiN) is described above as an embodiment of a material suitable for the first and second metal work function adjusting layers, other metal nitrides may be suitable for use with the present disclosure. For example, the metal layers may further comprise aluminum. In other examples, the first and second metal work function adjusting layers may include other metals from Groups IVB to VIB in the Periodic Table, including, e.g., tantalum nitride (TaN), niobium nitride (NbN), vanadium nitride (VN), tungsten nitride (WN), and the like with a thickness of about 20 Angstroms to about 30 Angstroms.

The conductive electrodes 34a, 34b may be composed of any metal containing material. For example, the conductive electrodes 34a, 34b may be composed of tungsten (W) or a tungsten including alloy. In other examples, the conductive electrodes 34a, 34b are composed of aluminum (Al), copper (Cu), platinum (Pt), silver (Ag) or an alloy thereof including allows with tungsten (W).

The first and second gate structures 30a, 30b is suitable for activation anneals for the source and drain regions of the n-type planar FET 100a and the p-type planar FET 100b at temperatures of greater than 500° C. for gate first processing.

Still referring to FIG. 1, a gate sidewall spacer 35 is present on each of the gate structures 30a, 30b. The gate sidewall spacer 35 may be composed of any dielectric material, such as silicon oxide or silicon nitride.

The n-type planar FET 100a includes n-type dopants in the first portion 15 of the substrate 10 for the source region 40a and drain region 45a that are positioned on opposing sides of the first gate structure 30a. In some embodiments, a n-type dopant in a type III-V semiconductor material, such as InGaAs, can be element from Group IIA or VIA of the Periodic Table of Elements). As used herein, "n-type" refers to the addition of impurities that contributes free electrons to an intrinsic semiconductor. In some embodiments, the dopant for providing an n-type device in a type III-V semiconductor material may be from Group IV of the periodic table of elements, such as silicon.

The p-type planar FET 100b includes p-type dopants in the second portion 20 of the substrate 10 for the source region 40b and drain region 45b that are positioned on opposing sides of the second gate structure 30b. As used herein, "p-type" refers to the addition of impurities to an intrinsic semiconductor that creates deficiencies of valence electrons. In a type IV semiconductor surface, such as the germanium containing second portion 20, e.g., silicon germanium (SiGe) second portion 20, of the substrate, examples of p-type dopants, i.e., impurities, include but are not limited to boron, aluminum, gallium and indium. The p-type dopant within the source and drain regions 40b, 45b is typically present in a concentration ranging from about $10^{11}$ to about $10^{15}$ atoms/$cm^2$, with a concentration of dopant within the doped region from about $10^{11}$ to about $10^{13}$ atoms/$cm^2$ being more typical.

Although not depicted in the supplied figures the source and drain regions 40a, 40b, 45a, 45b for the p-type planar FET 100b and the n-type planar FET 100a may further include raised source and drain regions. Raised source and drain regions may include in-situ doped epitaxially formed semiconductor material that is formed on the upper surface of the substrate 10 in which the source and drain regions 40a, 40b, 45a, 45b are present.

Referring to FIG. 1, in some embodiments, the first gate structure 30a to the n-type planar semiconductor device 100a is composed of a first conductive electrode 34a of tungsten (W), a first metal work function layer 33a of titanium nitride (TiN), a first high-k gate dielectric layer 32a of hafnium oxide ($HfO_2$), and an interface oxide of silicon oxide ($SiO_2$), in which the first gate structure 30a is present on a first portion 15 of the substrate 10 that is composed of $In_{0.53}Ga_{0.47}As$, and the effective work function for the first gate structure 30a to the n-type planar semiconductor device 100a ranges from 4.4 eV to 4.6 eV. The p-type planar semiconductor device 100b is present on the same substrate 10 as the n-type planar semiconductor device 100a. The p-type planar semiconductor device 100b may have the same gate structure as the first gate structure 30a for the n-type planar semiconductor device 100a. In one example, the second gate structure 30b to the p-type planar semiconductor device 100b is composed of a second conductive electrode 34b of tungsten (W), a second metal work function layer 33b of titanium nitride (TiN), a second high-k gate dielectric layer 32b of hafnium oxide ($HfO_2$), and an interface layer 31b of silicon oxide ($SiO_2$), in which the first gate structure 30b is present on a second portion 20 of the substrate 10 that is composed of silicon germanium (SiGe) having a germanium (Ge) concentration that is greater than 50 at. %, and the effective work function for the first gate structure 30a to the p-type planar semiconductor device 100b ranges from 4.4 eV to 4.6 eV.

In another embodiment, the aforementioned effective work functions (EWF) can be provided for each of the p-type planar semiconductor device and the n-type planar semiconductor device using a titanium nitride (TiN) atomic layer deposition (ALD) formed material layer for the first and second metal work function adjusting layers 33a, 33b in combination with a first and second interface layer 31a, 31b comprising doping with Group IIA and/or Group IIIB dielectric doping.

Although the semiconductor devices described herein are field effect transistors (FETs), the present disclosure is equally applicable to any semiconductor device that exhibits a change in conductivity in response to the application of a threshold voltage.

The CMOS device depicted in FIG. 1 may be formed using a gate first process that is described with reference to FIGS. 2-5.

Figure 2:
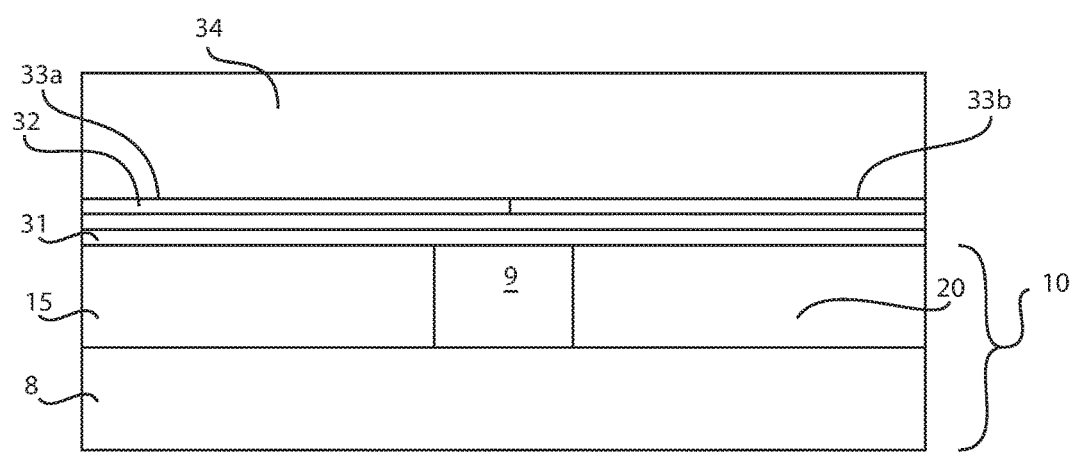
FIG. 2 is a side cross-sectional view depicting forming the material layers for a first gate structure and a second gate structure to a substrate having a first portion composed of type III-V semiconductor material and a second portion composed of a germanium containing semiconductor material, in accordance with one embodiment.

FIG. 2 depicts one embodiment of forming the material layers for a first gate structure 30a and a second gate structure 30b on a substrate 10 having a first portion 15 composed of type III-V semiconductor material and a second portion 20 composed of a germanium containing semiconductor material. The different compositions of the first and second portions 15, 20 of the substrate 10 can be formed using epitaxial growth, layer transfer, bonding, and deposition processes to position the different composition materials on a base substrate 8, such as a bulk silicon wafer. The isolation regions 9 separating the first portion 15 of the substrate 10 from the second portion 20 of the substrate 10 can be formed by etching a trench utilizing a dry etching process, such as reactive-ion etching (RIE) or plasma etching. A deposition process is used to fill the trench with oxide grown from tetraethylorthosilicate (TEOS) precursors, high-density oxide or another like trench dielectric material. After trench dielectric fill, the structure may be subjected to a planarization process.

The interface layer 31 may be formed using a thermal oxidation method. For example, when the interface layer 31 is composed of silicon oxide it can be formed using thermal oxidation. In the embodiments, in which the interface layer 31 is formed with a group IIA or group IIIB dielectric doping layer, the interface layer 31 may be formed using a deposition method, such as chemical vapor deposition (CVD) or atomic layer deposition (ALD). Variations of CVD processes suitable for forming the interface layer 31 include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

In the embodiment depicted in FIG. 2, the interface layer 31 is a single layer having the same composition for both of the first and second portions 15, 20 of the substrate 10. Embodiments have been contemplated, in which the composition of the interface layer 31 that is present on the first portion 15 of the substrate 10 is different than the composition of the interface layer 31 that is present on the second portion 20 of the substrate 10. The different portions, i.e., first and second portion 15, 20, of the substrate 10 may be independently processed by forming a first block mask over one portion of the substrate and processing the exposed portion, followed by removing the first block mask, forming a second block mask over the previously processed portion and processing the newly exposed portion.

The high-k gate dielectric layer 32 can be formed by a thermal growth process such as, for example, oxidation, nitridation or oxynitridation. The high-k gate dielectric layer 32 can also be formed by a deposition process such as, for example, chemical vapor deposition (CVD), plasma-assisted CVD, metal-organic chemical vapor deposition (MOCVD), atomic layer deposition (ALD), evaporation, reactive sputtering, chemical solution deposition and other like deposition processes. The high-k gate dielectric layer 32 may also be formed utilizing any combination of the above processes. The high-k gate dielectric layer 32 typically has a thickness ranging from 1 nm to 10 nm. In one example, the high-k gate dielectric layer 32 has a thickness ranging from 2 nm to 5 nm. The high-k gate dielectric layer 32 may be composed of a single composition high-k dielectric layer that provides the same composition for the first and second high-k gate dielectric layers 32a, 32b following gate patterning.

Referring to FIG. 2, following formation of the high-k gate dielectric layer 32, the first and second metal work function adjusting layers 33a, 33b may be formed. In one embodiment, a work function metal layer comprising titanium nitride (TiN) may be deposited by a physical vapor deposition (PVD) method, such as sputtering. Examples of sputtering apparatus that may be suitable for depositing the work function metal layer include DC diode type systems, radio frequency (RF) sputtering, magnetron sputtering, and ionized metal plasma (IMP) sputtering. In addition to physical vapor deposition (PVD) techniques, the p-type work function metal layer may also be formed using chemical vapor deposition (CVD) and atomic layer deposition (ALD).

In some embodiments, the first and second metal work function adjusting layers 33a, 33b can be formed with the deposition of a single layer of work function adjusting material. In this example, the composition of the first metal work function layer 33a is the same as the composition of the second metal work function layer 33b. In the example that is depicted in FIG. 2, the composition of the first metal work function layer 33a can be different than the composition of the second metal work function layer 33b. The different portions, i.e., first and second portion 15, 20, of the substrate 10 may be independently processed to provide a first metal work function layer 33a having a different than the composition of the second metal work function layer 33b by forming a first block mask over one portion of the first and second portions 15, 20 of the substrate 10 and processing the exposed portion. Once one of the first and second metal work function layer 33a, 33b is formed on the substrate, the first block mask is removed. A second block mask may be formed over the portion of the substrate in which the work function metal layer was previously formed leaving another portion of the substrate exposed. A second work function metal layer may then be formed on the exposed portion of the substrate. The second block mask may then be removed. The block masks may be soft masks, e.g., photoresist masks, or the block masks may be hard masks, e.g., a mask composed of a nitride or oxide material.

In one embodiment, each of the first and second metal work function adjusting layers 33a, 33b may be formed of titanium nitride with stoichiometric tuning to provide the appropriate work function adjustments for the n-type field effect transistor 100a and the p-type field effect transistor 100b. Stoichiometric tuning can be accomplished by adjusting the titanium (Ti) to nitrogen (N) ratio during the physical vapor deposition (PVD) sputtering program for forming the material layer. In some embodiments, the titanium nitride layers may be formed using atomic layer deposition (ALD).

Still referring to FIG. 2, a conductive electrode layer 34 may be formed on the first and second metal work function layers 33a, 33b. The conductive electrode layer 34 may be blanket deposited overlying both the first and second metal work function layers 33a, 33b. The conductive electrode layer 34 may be deposited using a physical vapor deposition method. For example, the conductive electrode layer 34 may be deposited using plating, electroplating, electroless plating, sputtering and combinations thereof. Examples of sputtering apparatus that may be suitable for depositing the work function metal layer include DC diode type systems, radio frequency (RF) sputtering, magnetron sputtering, and ionized metal plasma (IMP) sputtering. In addition to physical vapor deposition (PVD) techniques, the conductive electrode layer 34 may also be formed using chemical vapor deposition (CVD).

Figure 3:
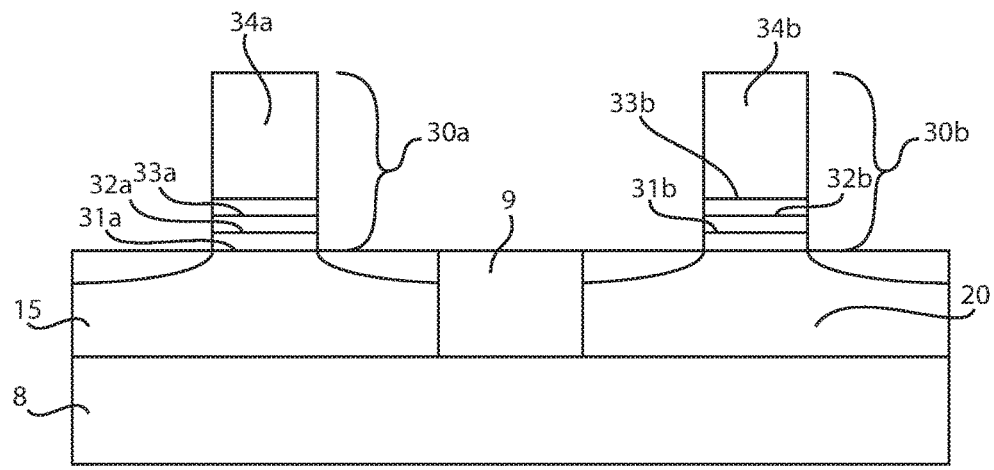
FIG. 3 is a side cross-sectional view depicting patterning the material layers to provide a first gate structure in the first portion of the substrate, and a second gate structure in the second portion of the substrate.

FIG. 3 is depicts patterning the material layers depicted in FIG. 2 to provide a first gate structure 30a in the first portion 15 of the substrate 10, and a second gate structure 30b in the second portion 20 of the substrate 10. The patterned gate structures 30a, 30b are formed utilizing photolithography and etch process steps. Specifically, a pattern is produced by applying a photoresist to the surface to be etched; exposing the photoresist to a pattern of radiation; and then developing the pattern into the photoresist utilizing conventional resist developer. Once the patterning of the photoresist is completed, the sections covered by the photoresist are protected while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied. The etch process for etching the exposed portions of the interface layer 31, the high-k gate dielectric layer 32, the first and second metal work function layers 33a, 33b, and the conductive electrode layer 34 may include an anisotropic etch, such as reactive ion etching (RIE). Following the etch process, the remaining portions of the interface layer provide the first and second interface layer 31a, 31b, the remaining portions of the high-k dielectric layer provide the first and second high-k dielectric layer 32a, 32b, and the remaining portions of the conductive electrode layer 34 provide the first and second conductive electrodes 34a, 34b.

Figure 4:
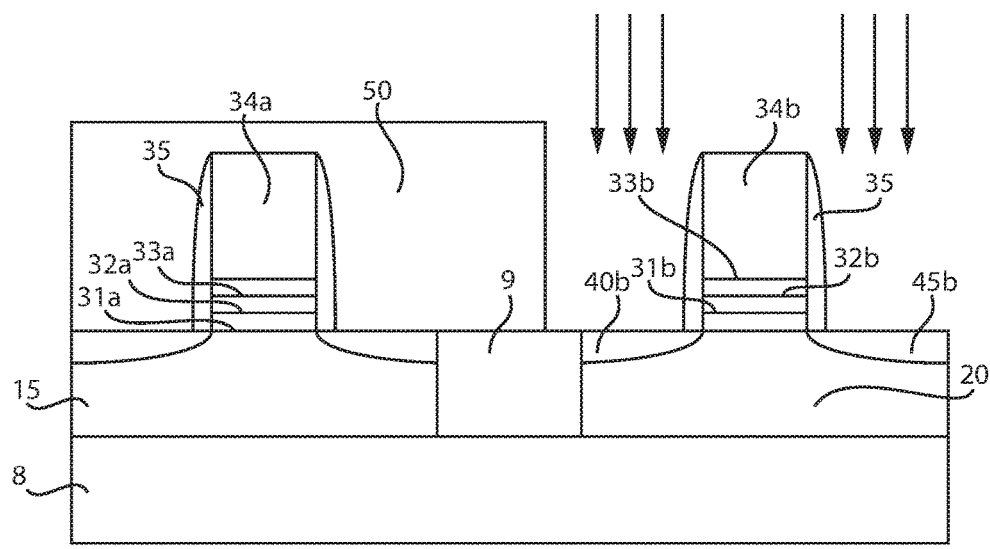
FIG. 4 is a side cross-sectional view depicting forming a block mask over the first portion of the substrate, and forming p-type source and drain regions in the second portion of the substrate, in accordance with one embodiment of the present disclosure.

Referring to FIG. 4, a gate sidewall spacer 35 may then be formed on each of the first and second gate structures 30a, 30b. The gate sidewall spacer 35 may be composed of oxide, i.e., $SiO_2$, but may also comprise nitride or oxynitride materials. Each gate sidewall spacer 35 may have a width ranging from 50.0 nm to 100.0 nm. The gate sidewall spacer 35 can be formed by deposition and etch processes.

FIG. 4 further depicts implanting dopants into the second portion 20 of the substrate 10 to provide a p-type source region 40b and a p-type drain region 45b. The source regions 40a, 40b and drain regions 45a, 45b for the planar semiconductor devices are formed ion implantation. In the embodiment that is depicted in FIG. 4, a block mask 50 is formed over the first portion 15 of the substrate 10 in which the n-type source region 40a, and p-type drain region 45a is formed. After the p-type source region 40b and p-type drain region 45b is formed in the second region 20 of the substrate 10, the n-type source region 40a and n-type drain region 45a can then be formed in the first portion 15 of the substrate 10. This can begin with removing the block mask 50, and forming another block mask (not shown) over the second portion 20 of the substrate 10, in which the p-type source region 40a and the p-type drain region 45b have been formed. The block mask that is formed over the second portion 20 of the substrate 10 leaves the first portion 15 of the substrate 10 exposed. The n-type source region 40a and n-type drain region 40b may then be formed in the first portion 15 of the substrate 10.

Although FIG. 4 only depicts forming source and drain regions within the surface of the first and second portions 15, 20 of the substrate 10. The present disclosure is not limited to only this example. For example, raised source and drain regions may be present on the upper surfaces of the first and second portions 15, 20 on opposing sides of the gate structures 30a, 30b. The raised source and drain regions may be formed of epitaxially deposited semiconductor material and may have the same dopant conductivity as the source and drain region 40a, 40b, 45a, 45b that the epitaxial material is formed on.

Following formation of the source and drain regions 40a, 40b, 45a, 45b they may be activated using an activation anneal. For example, the anneal process may include a temperature greater than 500°. In other embodiments, the anneal process can include a temperature ranging from 850° C. to 1350° C.

The above process sequence can provide the CMOS device depicted in FIG. 1, including a first gate structure 30a to the n-type planar semiconductor device 100a that is composed of a first conductive electrode 34a of tungsten (W), a first metal work function layer 33a of titanium nitride (TiN), a first high-k gate dielectric layer 32a of hafnium oxide ($HfO_2$), and an interface oxide of silicon oxide ($SiO_2$), in which the first gate structure 30a is present on a first portion 15 of the substrate 10 that is composed of $In_{0.53}Ga_{0.47}As$, and the effective work function for the first gate structure 30a to the n-type planar semiconductor device 100a ranges from 4.4 eV to 4.6 eV. The p-type planar semiconductor device 100b is present on the same substrate 10 as the n-type planar semiconductor device 100a. The p-type planar semiconductor device 100b may have the same gate structure as the first gate structure 30a for the n-type planar semiconductor device 100a. In one example, the second gate structure 30b to the p-type planar semiconductor device 100b is composed of a second conductive electrode 34b of tungsten (W), a second metal work function layer 33b of titanium nitride (TiN), a second high-k gate dielectric layer 32a of hafnium oxide ($HfO_2$), and an interface oxide of silicon oxide ($SiO_2$), in which the first gate structure 30b is present on a second portion 20 of the substrate 10 that is composed of silicon germanium (SiGe) having a germanium (Ge) concentration that is greater than 50 at. %, and the effective work function for the first gate structure 30a to the n-type planar semiconductor device 100a ranges from 4.4 eV to 4.6 eV.

Figure 5:
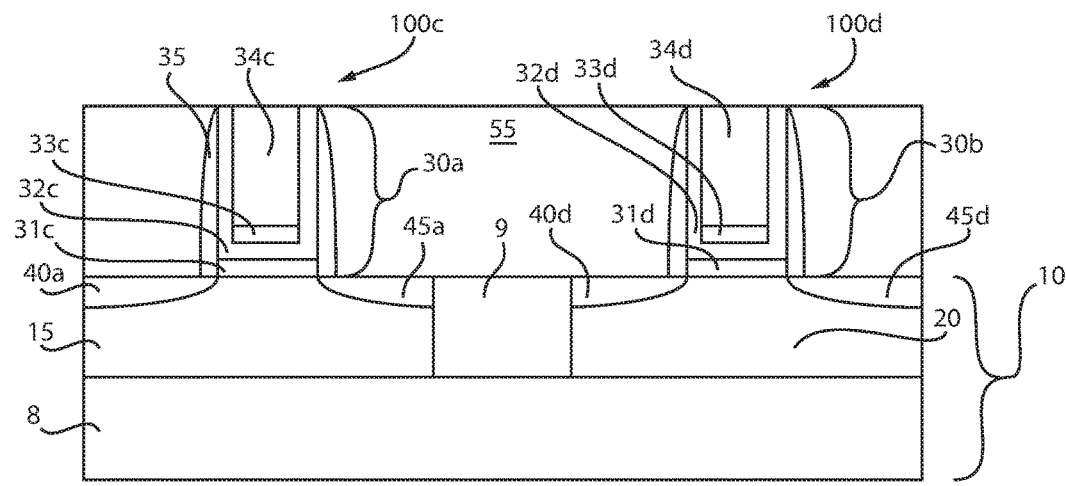
FIG. 5 is a side cross-sectional view depicting a planar n-type field effect transistor (FET) on a first portion of a substrate composed of a type III-V semiconductor material, and a planar p-type field effect transistor (FET) on a second portion of the substrate composed of a germanium containing material, in which the n-type and p-type field effect transistors include work function adjustments and are formed using gate last methods, in accordance with one embodiment of the present disclosure.

The present disclosure also provide methods and structures for providing work function adjustments for CMOS devices having planar n-type FETs formed on III-V semiconductor materials, and planar p-type FETs formed on germanium containing semiconductor materials using gate last processing, which may also be referred to as replacement gate processing or replacement metal gate (RMG) processing. FIG. 5 depicts one embodiment of a planar n-type field effect transistor (FET) 100c on a first portion 15 of a substrate 10 composed of a type III-V semiconductor material, and a planar p-type field effect transistor (FET) 110d on a second portion 20 of the substrate 10 composed of a germanium containing material, in which the n-type and p-type field effect transistors include work function adjustments and are formed using gate last methods.

The substrate 10 that is depicted in FIG. 5 has been described above with reference to FIG. 1. Therefore, the description of the substrate 10 including the description of the first portion 15 and the second portion 20, as well as the base substrate 8 and the isolation region 9, that has been provided above with reference to FIG. 1 is suitable for the description of these similarly labeled elements in FIG. 5. For example, in one embodiment, the first portion 15 of the substrate 10 depicted in FIG. 5 is composed of a type III-V semiconductor material, such as $In_{0.53}Ga_{0.47}As$, and the second portion 20 of the substrate 10 is composed of a germanium (Ge) containing material, such as silicon germanium (SiGe) with greater than 50 at % Germanium (Ge). The work function adjustments made using the first and second gate structures 30a, 30b depicted in FIG. 5 that are provided in the present disclosure can produce an effective work function (EWF) for each of the n-type and p-type planar FETs 100c, 100d that ranges from 4.3 eV to 4.7 eV.

Similar to the n-type field effect transistor 100a that is depicted in FIG. 1, the n-type field effect transistor 100c depicted in FIG. 5 may include a first gate structure 30a that includes a first interface dielectric layer 31c formed on the channel region of the first portion 15 of the substrate 10; a first high-k gate dielectric layer 32c that is present on the first interface dielectric layer 31a; a first metal work function adjusting layer 33c that is present on the first high-k gate dielectric layer 32c; and a first conductive electrode 34c.

The description of the first interface dielectric layer 31a, and the first conductive electrode 34a, of the n-type field effect transistor 100a that is depicted in FIG. 1 is suitable for the description of the first interface dielectric layer 31c, and the first conductive electrode 34c that is depicted in FIG. 5. The first high-k dielectric layer 32c that is depicted in FIG. 5 includes a horizontal base portion and two vertical sidewall portions, which result from the gate last process for forming the gate structures. With the exception of the U-shaped geometry of the first high-k gate dielectric layer 32c that is depicted in FIG. 5, the description of the first high-k gate dielectric layer 32a that is depicted in FIG. 1 is suitable for the description of the first high-k gate dielectric layer 32c that is depicted in FIG. 5. For example, the first high-k gate dielectric layer 32c may be composed of hafnium oxide ($HfO_2$).

The first metal work function adjusting layer 33c that is present in the first gate structure 30a to the n-type planar FET 100c formed using gate last processing may be a composite layer, i.e., a multi-layered structure, including at least one aluminum (Al) containing layer. For example, the first metal work function adjusting layer 33c may be composed of a first layer of titanium nitride (TiN) that is present on the first high-k dielectric layer 32c, a second layer of titanium aluminum carbide (TiAlC) that is present on the first layer of titanium nitride (TiN), and a third layer of titanium nitride (TiN) that is present on the second layer of titanium aluminum carbide (TiAlC). In another example, the first metal work function adjusting layer 33c may be composed of a first layer of titanium nitride (TiN) that is present on the first high-k dielectric layer 32c, a second layer of titanium aluminide (TiAl) that is present on the first layer of titanium nitride (TiN), and a third layer of titanium nitride (TiN) that is present on the second layer of titanium aluminide (TiAl). The thickness of each layer in the composite layer that provides the first metal work function adjusting layer may range from about 30 Angstroms to about 60 Angstroms.

Similar to the p-type field effect transistor 100b that is depicted in FIG. 1, the p-type field effect transistor 100d depicted in FIG. 5 may include a second gate structure 30b that includes a second interface dielectric layer 31d formed on the channel region of the second portion 20 of the substrate 10; a second high-k gate dielectric layer 32d that is present on the second interface dielectric layer 31d; a second metal work function adjusting layer 33d that is present on the second high-k gate dielectric layer 32d; and a second conductive electrode 34d.

The description of the second interface dielectric layer 31b, and the second conductive electrode 34b, of the p-type field effect transistor 100b that is depicted in FIG. 1 is suitable for the description of the second interface dielectric layer 31d, and the second conductive electrode 34d that is depicted in FIG. 5. The second high-k dielectric layer 32d that is depicted in FIG. 5 includes a horizontal base portion and two vertical sidewall portions, which result from the gate last process. With the exception of the U-shaped geometry of the second high-k gate dielectric layer 32d that is depicted in FIG. 5, the description of the second high-k gate dielectric layer 32b that is depicted in FIG. 1 is suitable for the description of the second high-k gate dielectric layer 32d that is depicted in FIG. 5. For example, the second high-k gate dielectric layer 32d may be composed of hafnium oxide ($HfO_2$).

The second metal work function adjusting layer 33d that is present in the second gate structure 30b to the p-type planar FET 100d formed using gate last processing may be a composite layer, i.e., a multi-layered structure, including at least one aluminum (Al) containing layer. For example, the second metal work function adjusting layer 33d may be composed of a first layer of titanium nitride (TiN) that is present on the second high-k dielectric layer 32d, a second layer of titanium aluminum carbide (TiAlC) that is present on the first layer of titanium nitride (TiN), and a third layer of titanium nitride (TiN) that is present on the second layer of titanium aluminum carbide (TiAlC). In another example, the second metal work function adjusting layer 33d may be composed of a first layer of titanium nitride (TiN) that is present on the second high-k dielectric layer 32d, a second layer of titanium aluminide (TiAl) that is present on the first layer of titanium nitride (TiN), and a third layer of titanium nitride (TiN) that is present on the second layer of titanium aluminide (TiAl). The thickness of each layer in the composite layer that provides the second metal work function adjusting layer 33d may range from about 30 Angstroms to about 60 Angstroms.

The composition of each material layer in the first gate structure 30a may be the same as the composition of each material layer in the second gate structure 30b. In some embodiments, the composition of at least one material layer in the first gate structure 30a may be different from the composition of at least one material layer in the second gate structure 30b.

Referring to FIG. 5, a gate sidewall spacer 35 is present on each of the gate structures 30a, 30b. The gate sidewall spacer 35 may be composed of any dielectric material, such as silicon oxide or silicon nitride. The p-type planar FET 100b includes p-type dopants in the second portion 20 of the substrate 10 for the source region 40b and drain region 45b that are positioned on opposing sides of the second gate structure 30b. The n-type planar FET 100a includes n-type dopants in the first portion 15 of the substrate 10 for the source region 40a and drain region 45a that are positioned on opposing sides of the first gate structure 30a. Further details regarding the dopants used to provide the source and drain regions 40a, 40b, 45a, 45b are provided above in the description of FIG. 1. Although not depicted in FIG. 5, the source and drain regions 40a, 40b, 45a, 45b for the p-type planar FET 100d and the n-type planar FET 100c may further include raised source and drain regions.

Still referring to FIG. 5, an interlevel dielectric layer 55 is present overlying the source and drain regions 40a, 40b, 45a, 45b and has an upper surface that is coplanar with an upper surface of the first and second gate structures 30a, 30b. As will be described below, the interlevel dielectric 55 is formed prior to removing a replacement gate structure, also referred to as sacrificial gate structure. The first and second gate structures 30a, 30b are formed after the replacement gate structures are removed, and the u-shaped geometry is indicative of the gate last methodology.

Referring to FIG. 5, in some embodiments, the first gate structure 30a to the n-type planar semiconductor device 100c is composed of a first conductive electrode 34c of tungsten (W), a first metal work function layer 33c that is a composite of TiN/TiAlC/TiN or a composite of TiN/TiAl/TiN, a first high-k gate dielectric layer 32c of hafnium oxide (HfO$_2$), and an interface oxide of silicon oxide (SiO$_2$), in which the first gate structure 30a is present on a first portion 15 of the substrate 10 that is composed of In$_{0.53}$Ga$_{0.47}$As, and the effective work function for the first gate structure 30a to the n-type planar semiconductor device 100c ranges from 4.4 eV to 4.6 eV. The p-type planar semiconductor device 100d is present on the same substrate 10 as the n-type planar semiconductor device 100c, as depicted in FIG. 5. The p-type planar semiconductor device 100d may have the same gate structure as the first gate structure 30a for the n-type planar semiconductor device 100c. In one example, the second gate structure 30b to the p-type planar semiconductor device 100d is composed of a second conductive electrode 34d of tungsten (W), a second metal work function layer 33d that is a composite of TiN/TiAlC/TiN or a composite of TiN/TiAl/TiN, a second high-k gate dielectric layer 32d of hafnium oxide (HfO$_2$), and an interface oxide 31d of silicon oxide (SiO$_2$), in which the second gate structure 30b is present on a second portion 20 of the substrate 10 that is composed of silicon germanium (SiGe) having a germanium (Ge) concentration that is greater than 50 at. %, and the effective work function for the first gate structure 30a to the n-type planar semiconductor device 100a ranges from 4.4 eV to 4.6 eV.

The CMOS device depicted in FIG. 2 may be formed using a gate last process that is described with reference to FIGS. 6-8.

Figure 6:
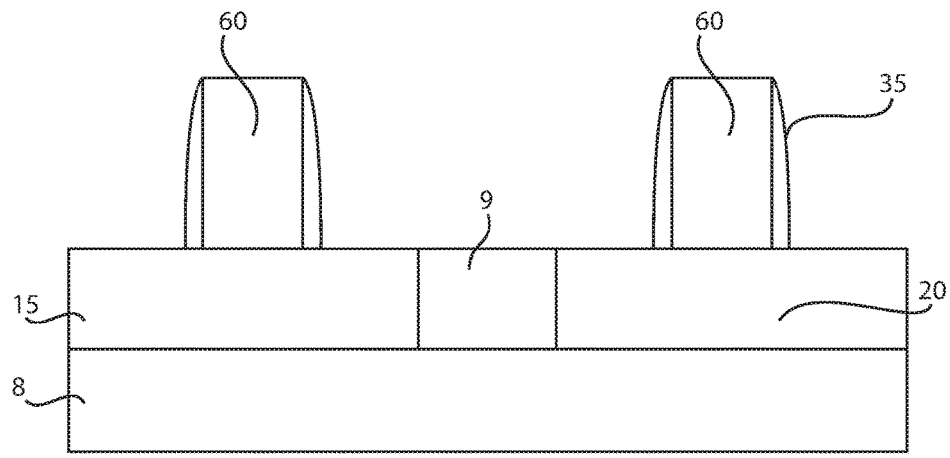
FIG. 6 is a side cross-sectional view depicting forming replacement gate structures on a first portion of a substrate that is comprised of a type III-V semiconductor material and second portion of the substrate that is comprised of a germanium containing semiconductor material, in accordance with one embodiment of the present disclosure.

FIG. 6 depicts forming replacement gate structures 60 on a first portion 15 of a substrate 10 that is comprised of a type III-V semiconductor material and second portion 20 of the substrate 10 that is comprised of a germanium containing semiconductor material. In some embodiments, the replacement gate structures 60 that are depicted in FIG. 6 are formed of a semiconductor material, such as polysilicon. But, in other embodiments, the replacement gate structures 60 may be composed of a dielectric material. The replacement gate structures 60 may be formed using deposition, photolithography and etching processes, similar to the functional gate structures that are described above with reference to FIG. 2. The replacement gate structures 60 are formed to have a geometry that matches the geometry of the later formed functional gate structures.

Figure 7:
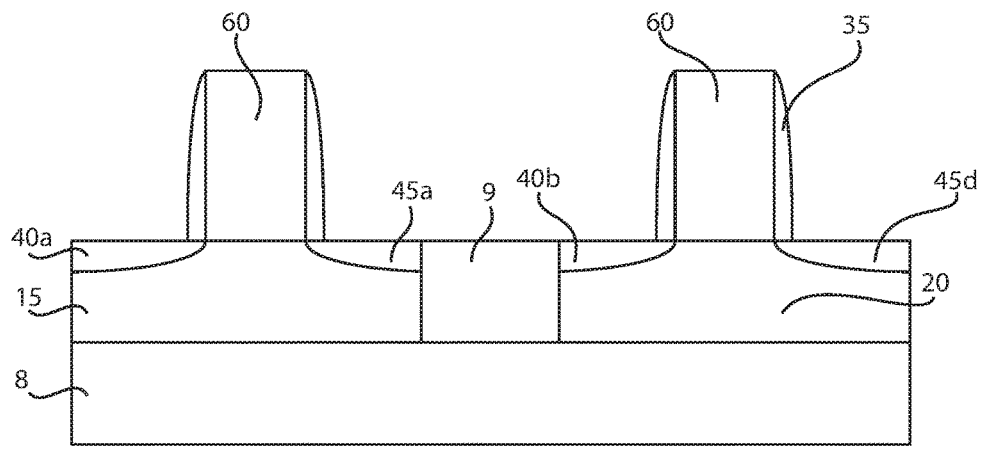
FIG. 7 is a side cross-sectional view depicting forming n-type source and drain regions in a first portion of the substrate, and forming p-type source and drain regions in a second portion of the substrate, in accordance with one embodiment of the present disclosure.

FIG. 7 depicts forming n-type source and drain regions 40a, 45a in the first portion 15 of the substrate 10, and forming p-type source and drain regions 40b, 45b in a second portion 20 of the substrate 10. The source and drain regions 40a, 40b, 45a, 45b depicted in FIG. 7 may be formed using ion implantation while the replacement gate structures 60 are present on the substrate 10. The source and drain regions 40a, 40b, 45a, 45b that are depicted in FIG. 7 are similar to the source and drain regions 40a, 40b, 45a, 45b that are depicted in FIGS. 1, 4 and 5. Therefore, the above description of the source and drain regions 40a, 40b, 45a, 45b that are depicted in FIGS. 1, 4 and 5 is suitable for providing further details regarding the source and drain regions 40a, 40b, 45a, 45b that are depicted in FIG. 7.

The method may continue with activating the source and drain regions 40a, 40b, 45a, 45b. Activation of the source and drain regions 40a, 40b, 45a, 45b may be done with the replacement gate structure present on the substrate 10. This provides that the later formed functional gate structure is not subjected to the high temperature anneal process. Further details regarding the activation anneal have been described above with reference to FIGS. 1-4.

Figure 8:
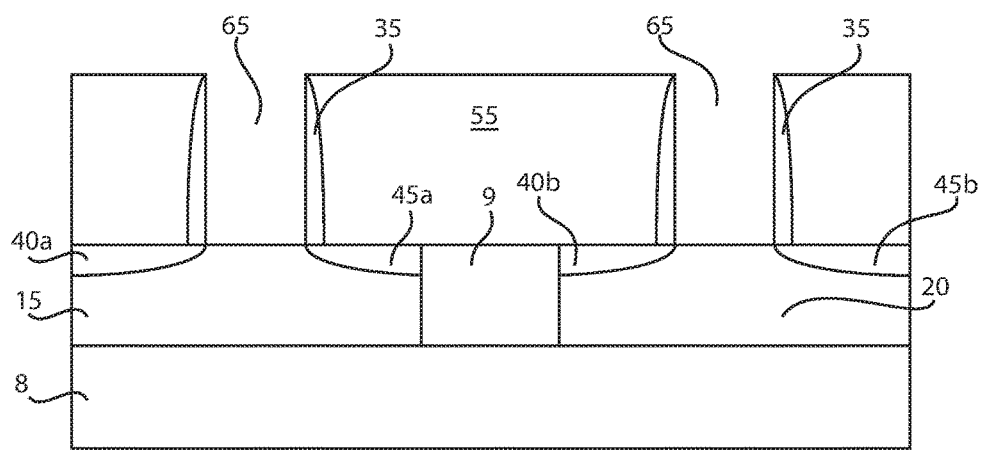
FIG. 8 is a side cross-sectional view depicting forming an interlevel dielectric layer over the structure depicted in FIG. 7, and removing the first and second replacement gate structures, in accordance with one embodiment of the present disclosure.

FIG. 8 depicts one embodiment of forming an interlevel dielectric layer 55 over the structure depicted in FIG. 7, and removing the first and second replacement gate structures 60. The interlevel dielectric layer 55 may be deposited on the structure depicted in FIG. 7, using chemical solution deposition, spin on deposition, chemical vapor deposition or a combination thereof. The interlevel dielectric layer 55 may be selected from the group consisting of silicon containing materials such as SiO$_2$, Si$_3$N$_4$, SiO$_x$N$_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable. Following deposition, the interlevel dielectric layer 55 may be planarized to provide an upper surface that is coplanar with an exposed upper surface of the replacement gate structures 60. In one example, the planarization process is chemical mechanical planarization (CMP). Once, the replacement gate structures 60 are exposed, they may be removed using a selective etch process.

After the replacement gate structures 60 are removed, gate openings 65 are present to the channel regions of the first portion 15 of the substrate 10 and the second portion 15 of the substrate 10. The gate openings 65 may then be filled with the material layers that provide the function gate structures for each of the n-type planar FET 100c and the p-type planar FET 100d, as depicted in FIG. 5. For example, each interface layer 31c, 31d may be provided by thermal growth or chemical vapor deposition. The high-k gate dielectrics 32c, 32d may be formed using chemical vapor deposition (CVD), such as plasma enhanced chemical vapor deposition (PECVD). Thereafter, the first metal work function layer 33c and the second metal work function metal layer 33d may be formed using a deposition method, such as atomic layer deposition (ALD) or physical vapor deposition (PVD). Examples of physical vapor deposition (PVD) used to form each of the first and second metal work function layer 33c, 33d can include sputtering methods or plating methods. The first and second conductive electrodes 34c, 34d may be deposited using a physical vapor deposition (PVD) method, such as plating, e.g., electroplating. It is noted that in the embodiments, in which the composition of the first gate structure 30a is the same as the second gate structure 30b, the materials layers for both gate structures may be formed simultaneously. In some embodiments, the material layers for one of the gate structures 30a, 30b may be formed independently than the material layers in the other gate structures 30a, 30b. This can be accomplished using block masks, as described in the above embodiments. By employing block masks, at least one of the material layers for the first gate structure 30a may have a composition that is different than the material layers in the second gate structure 30b.

In some embodiments, the gate last process flow that is illustrated with reference to FIGS. 5-8 may employ a tungsten fill for the first and second conductive electrodes 34a, 34b with a 400° C. process flow. In a replacement gate process flow, i.e., gate last process flow, the electrodes are not chemically or thermally stable for temperatures greater than 400° C., and can lead to unwanted threshold voltage shifts.

FIGS. 9A-15 illustrate some embodiments of the present disclosure in which work function adjustments are provided in fin type field effect transistors (FinFETs), in which n-type FinFETs are formed on type III-V semiconductor and p-type FinFETs are formed on germanium containing semiconductors. In some embodiments, the FinFETs may be formed using a gate first process, as described in FIGS. 9A to 11, and in some embodiments, the FinFETs may be formed using a gate last process, as described in FIGS. 12-15.

Figure 9A:
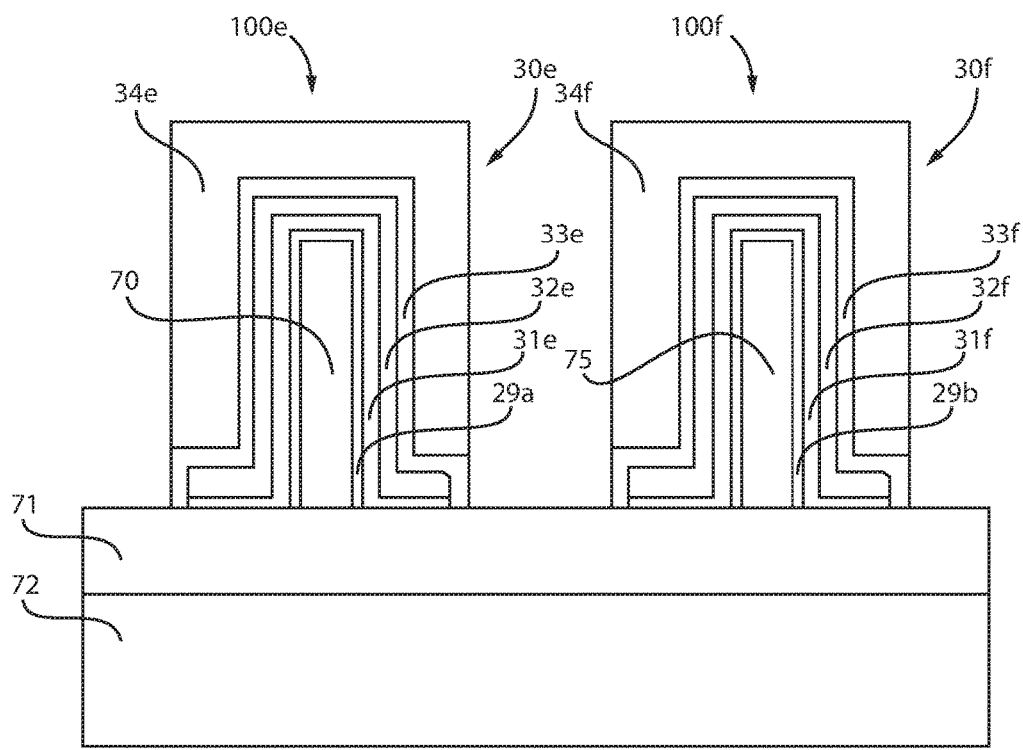
FIG. 9A is a side cross-sectional view depicting an n-type fin field effect transistor (n-FinFET) with a first fin structure composed of a type III-V semiconductor material, and a p-type fin field effect transistor (p-FinFET) with a second fin structure composed of a germanium containing material, in which the n-type and p-type fin field effect transistors (FinFETs) include work function adjustments and are formed using gate first methods, in accordance with one embodiment of the present disclosure.
Figure 9B:
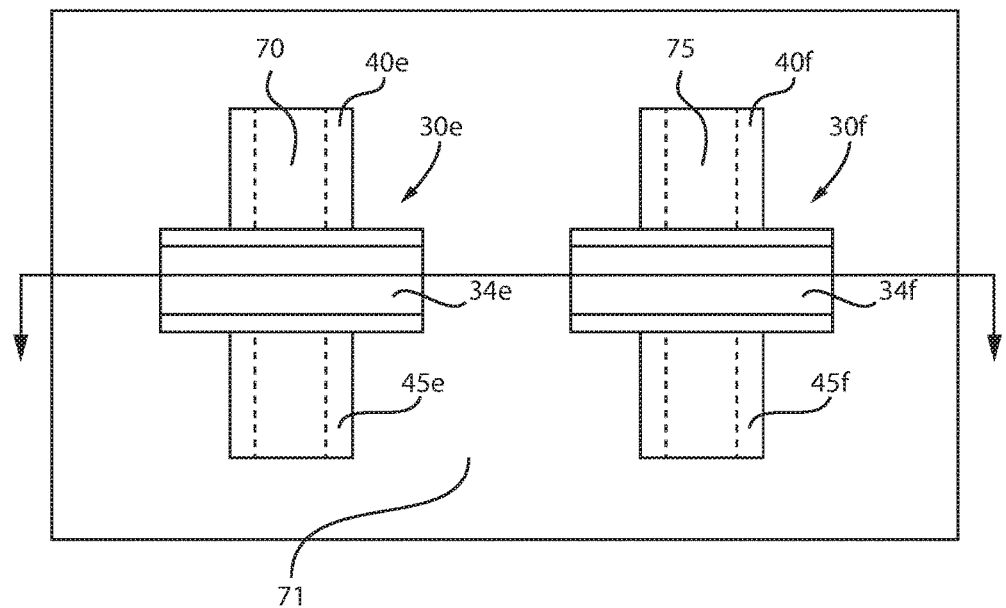
FIG. 9B is a top down view of the structure depicted in FIG. 9A, in which the structure depicted in FIG. 9A is a cross section along section line A-A in FIG. 9B.

FIGS. 9A and 9B depict one embodiment of an n-type fin field effect transistor (n-FinFET) 100e with a first fin structure 70 composed of a type III-V semiconductor material, and a p-type fin field effect transistor (p-FinFET) 100f with a second fin structure 75 composed of a germanium containing material, in which the n-type and p-type fin field effect transistors (FinFETs) 100e, 100f include work function adjustments and are formed using gate first methods. Each fin structure 70, 75 houses the channel region of the semiconductor device. The first fin structure 70 depicted in FIGS. 9A and 9B is composed of a type III-V semiconductor material, similar to the first portion 15 of the substrate 10 of the planar FETs depicted in FIGS. 1-8. Therefore, the above description of the composition of type III-V semiconductor materials provided for describing the first portion 15 of the substrate 10 is applicable for describing the type III-V semiconductor material for the first fin structure 70. For example, the type III-V semiconductor material of the first fin structure 70 may be $In_{0.53}Ga_{0.47}As$. The second fin structure 75 depicted in FIGS. 9A and 9B is composed of a germanium containing semiconductor material, similar to the second portion 20 of the substrate 10 of the planar FETs depicted in FIGS. 1-8. Therefore, the above description of the composition of germanium containing semiconductor materials provided for describing the second portion 20 of the substrate 10 is applicable for describing the germanium containing semiconductor material for the second fin structure 75. For example, the germanium containing semiconductor material for the second fin structure 75 may be silicon germanium (SiGe), in which the germanium (Ge) concentration is greater than 50 at. %. The geometry of each fin structure 70, 75 is three dimensional. Each of the fin structures 70, 75 may have a height ranging from 5 nm to 200 nm. In one embodiment, the fin structures 70, 75 have a height ranging from 20 nm to 50 nm. The fin structures 70, 75 may have a width of less than 20 nm. In another embodiment, the fin structures 70, 75 have a width ranging from 3 nm to 8 nm.

Each of the fin structures 70, 75 may be positioned on a dielectric layer 71, which may be an oxide or nitride material layer. In one example, the dielectric layer 71 is composed of silicon oxide ($SiO_2$). A supporting substrate 72 may be present underlying the dielectric layer 71. In some embodiments, the supporting substrate 72 may be composed of a semiconductor material, such as silicon (Si). In some other embodiments, the supporting substrate 72 can be composed of a dielectric material or a metal.

Each of the n-type and p-type fin field effect transistors 100e, 100f include a gate structure 30e, 30f having work function adjustments, which in some embodiments provides an effective work function ranging from 4.3 to 4.7 eV for each of the n-type and p-type fin field effect transistors 100e, 100f. In one example, an effective work function ranging from 4.4 eV to 4.6 eV can be provided for each of the n-type and p-type field effect transistors 100e, 100f.

The first and second fin structures 70, 75 may be further processed to form a conformal silicon containing layer 29a, 29b on their sidewall and upper surfaces. The conformal silicon containing layer 29a, 29b may be composed of amorphous silicon (α-Si), and may be deposited using chemical vapor deposition.

The n-type fin field effect transistor 100e may include a first gate structure 30e that includes a first interface dielectric layer 31e formed over the channel region of the first fin structure 70; a first high-k gate dielectric layer 32e that is present on the first interface dielectric layer 31e; a first metal work function adjusting layer 33e that is present on the first high-k gate dielectric layer 32e; and a first conductive electrode 34e.

The p-type fin field effect transistor 100f may include a second gate structure 30f that includes a second interface dielectric layer 31f formed on the channel portion of the second fin structure 75; a second high-k gate dielectric layer 32f that is present on the second interface dielectric layer 31f; a second metal work function adjusting layer 33f that is present on the second high-k gate dielectric layer 32f; and a second conductive electrode 34f.

In some embodiments, the n-type fin field effect transistor 100e is doped by an aluminum containing dielectric that provides the first interface dielectric layer 31e. For example, the aluminum containing dielectric that provides the first interface dielectric layer 31e may be composed of aluminum oxide ($Al_2O_3$), aluminum oxynitride, aluminum nitride (AlN), as well as other aluminum containing dielectrics. The first interface dielectric layer 31e may be present on the sidewalls surfaces and upper surface of the portion of the first fin structure 70 that contains the channel region of the device.

In some embodiments, the p-type fin field effect transistor 100f is doped by an dopant selected from Group IIA or Group IIIB of the Periodic Table of Elements that is integrated into the second interface dielectric layer 31f. Examples of dielectric dopants from Group IIA or Group IIIB of the Periodic Table of Elements may be selected from the group consisting of beryllium (Be), magnesium (Mg), barium (Ba), lanthanum (La), yttrium (Y) and combinations thereof. For example, the second interface dielectric layer 31f may be composed of lanthanum oxide ($La_2O_3$).

The thickness for each of the first and second interface dielectric layer 31e, 31f may range from 1 Å to 10 Å. In some examples, the thickness for each of the first and second interface dielectric layers 31e, 31f may be on the order of 2 Å to 6 Å.

The composition of the first high-k gate dielectric layer 32e and the second high-k dielectric layer 32f that are depicted in FIGS. 9A and 9B is similar to the first high-k gate dielectric layer 31a and the second high-k gate dielectric 32b that are depicted in FIG. 1. Therefore, the above description of the first and second high-k gate dielectric layer 32a, 32b that are depicted in FIG. 1 is suitable for the description of the first and second high-k gate dielectric layer 32e, 32f that are depicted in FIGS. 9A and 9B. For example, the first high-k gate dielectric layer 32e may be composed of hafnium oxide (HfO$_2$), and the second high-k gate dielectric layer 32f may be composed of hafnium oxide (HfO$_2$).

The first and second gate structures 30e, 30f may be formed using a single metal electrode, i.e., first and second metal work function adjusting layer 33e, 33f and first and second conductive electrode 34e, 34f for both of the first and second gate structures 30e, 30f. By single metal electrode it is meant that the composition for both the first and metal work function adjusting layers 33e, 33f as well as the composition for both of the first and second gate electrode 34e, 34f, is the same. For example, the first and second metal work function adjusting layers 33e, 33f may each be composed of metal nitride, such as titanium nitride (TiN). The first and second work function adjusting layers 3e, 33f may be deposited using atomic layer deposition (ALD). Although titanium nitride (TiN) is described above as an embodiment of a material suitable for the first and second metal work function adjusting layers, other metal nitrides may be suitable for use with the present disclosure. For example, the first and second metal work function adjusting layers may include other metals from Groups IVB to VIB in the Periodic Table, including, e.g., tantalum nitride (TaN), and the like with a thickness of about 30 Angstroms to about 60 Angstroms.

The first and second gate electrodes 34e, 34f that are depicted in FIG. 5 are similar to the first and second gate electrodes 34a, 34b that are depicted in FIG. 1. Therefore, the description of the composition of the first and second gate electrodes 34a, 34b that are depicted in FIG. 5 is suitable for the first and second gate electrodes 34e, 34f that are depicted in FIG. 1. Each of the first and second gate structures 30e, 30f may include a gate sidewall spacer 35.

The first and second gate structures 30e, 30f is suitable for activation anneals for the source and drain regions of the n-type fin FET 100e and the p-type fin FET 100e to temperatures greater than 500° C.

Referring to FIG. 9B, the n-type fin field effect transistor 100e includes n-type source regions 40e and n-type drain regions 45e, and the p-type fin field effect transistor 100f include p-type source regions 40f and p-type drain regions 45f. The source and drain regions 40e, 40f, 45e, 45f may be formed on source and drain portions of the fin structures, which are on opposing sides of the channel region. Each of the source and drain regions 40e, 40f, 45e, 45f may be composed of an extension region and an epitaxially formed in-situ doped portion. For example, the extension portion may be formed within the fin structure, and the epitaxially formed in-situ semiconductor material may be present on the exterior surface of the fin structure. The dopant types to provide the n-type and p-type conductivity has been described above with reference to FIGS. 1 and 4.

In one example, an n-type finFET 100e formed using a gate first process including a first gate structure 30e composed of a first conductive electrode 34e of tungsten (W), a first metal work function layer 33e of a single metal layer atomic layer deposited (ALD) titanium nitride (TiN), a first high-k gate dielectric layer 32e of hafnium oxide (HfO$_2$), and an interface layer 31e of aluminum oxide (Al$_2$O$_3$), which is present on a deposited silicon layer present on a first fin structure 70 that is composed of In$_{0.53}$Ga$_{0.47}$As can provide an effective work function of approximately 4.6 eV with a 100 to 200 mV pFET shift. This shift is to an effective work function that is greater than 4.6 eV. In the same example, the second gate structure 30f of the p-type FinFET semiconductor device 100f that is present on the same substrate 10 as the n-type FinFET semiconductor device 100c may include a second conductive electrode 34f of tungsten (W), a second metal work function layer 33f that is a composed of a single metal layer atomic layer deposited (ALD) titanium nitride (TiN), a second high-k gate dielectric layer 32e of hafnium oxide (HfO$_2$), and an interface layer 31e of lanthanum oxide (La$_2$O$_3$) in which the second gate structure 30f is present on a second fin structure 75 composed of silicon germanium (SiGe) having a germanium (Ge) concentration that is greater than 50 at. %, the effective work function for the p-type finFET 100f may be approximately 4.6 eV with a 300 mV to 400 mV nFET shift. This shift is to an effective work function that is less than 4.6 eV. In some examples, a dual metal atomic layer deposited (ALD) stack of titanium nitride and tantalum nitride may be substituted for the single metal atomic layer deposited (ALD) layer of titanium nitride (TiN) for each of the first and second metal work function adjusting layers 32e, 32f.

Figure 10:
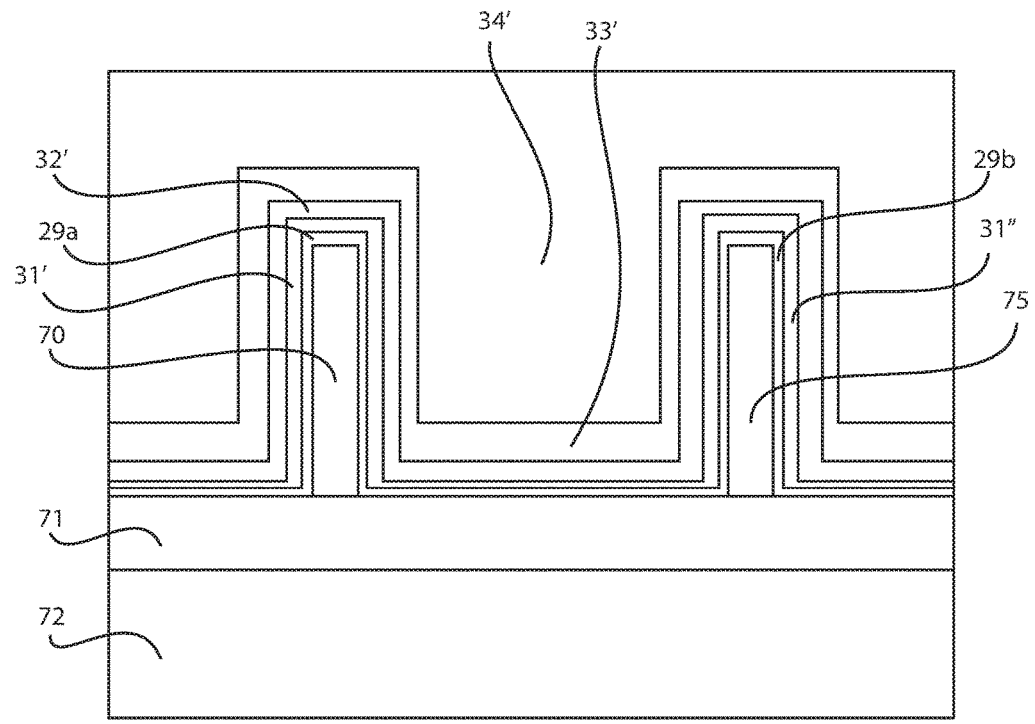
FIG. 10 is a side cross-sectional view depicting forming the material layers for a first gate structure and a second gate structure on a first fin structure composed of type III-V semiconductor material and a second fin structure composed of a germanium containing semiconductor material, in accordance with one embodiment of the present disclosure.

The CMOS device depicted in FIGS. 9A and 9B may be formed using a gate first process that is described with reference to FIGS. 10 and 11. FIG. 10 depicts forming the material layers for a first gate structure 30e and a second gate structure 30f on a first fin structure 70 composed of type III-V semiconductor material and a second fin structure 75 composed of a germanium containing semiconductor material. The material layers may be blanked deposited on the first and second fin structures 70, 75, as well as the upper surface of the dielectric layer 71 between the adjacent fin structures 70, 75.

The interface layer 31', 31'' that is processed to provide the first and second interface layer 31e, 32f may be formed using deposition processes in combination with block masks to control the positioning of the material being deposited. For example, a first block mask may be formed over the first fin structure, while an interface layer 31'' is deposited including dopant from Group IIA or Group IIIB of the periodic table of elements over the second fin structure 75 composed of the germanium containing material. Thereafter, the first block mask may be removed, and a second block mask may be formed over the previously deposited interface layer 31'' and the second fin structure 75. A first interface layer 31' of an aluminum containing dopant may then be formed over the first fin structure 70 of the type III-V semiconductor material. The first and second interface layers 31', 31'' may be deposited using chemical vapor deposition (CVD), such as plasma enhanced chemical vapor deposition.

Following formation of the first and second interface layers, a blanket deposited layers of high-k dielectric material 32' may be deposited on the first and second interface layers 31', 31'' over the first and second fin structures 70, 75. The high-k dielectric material 31' is later processed to provide the first high-k dielectric layer 31e and the second high-k dielectric layer 31f during patterning of the first and second gate structures 30e, 30f. The high-k dielectric material layer 32' may be deposited using any method that has been described above for forming the first and second high-k dielectric material layer 32a, 32b that has been described above with reference to FIG. 2.

In some embodiments, the first and second work function metal layers 33e, 33f that are formed on the first and second fin structures 70, 75 have the same composition. Forming the first and second work function metal layers 33e, 33f may begin with a blanket deposition of a work function metal layer 33' on the high-k gate dielectric layer 32', as well as over the first and second fin structures 70, 75. The work function metal layer 33' may be deposited using any method that has been described above for forming the first and second work function material layers 33a, 33b that have been described above with reference to FIG. 2.

The gate electrode material layer 34' for the first and second gate electrodes 34e, 34f may then be formed atop the work function metal layer 33'. The gate electrode material layer 34' is similar to the material layers deposited for the first and second gate electrodes 34a, 34b that are described in FIG. 2. For example, the gate electrode material layer 34' may be deposited using a physical vapor deposition (PVD) method, such as plating.

In a following process step, the gate electrode material layer 34', the work function metal layer 33', the layer of high-k dielectric material 32' and the first and second interface layers 31', 31" may be patterned to provide a first and second gate structure 30a, 30b. The first and second gate structures 30a, 30b may be patterned using deposition, photolithography and etching processes, similar to the methods for patterning the gate structures to the planar CMOS device described above with reference to FIG. 3.

Figure 11:
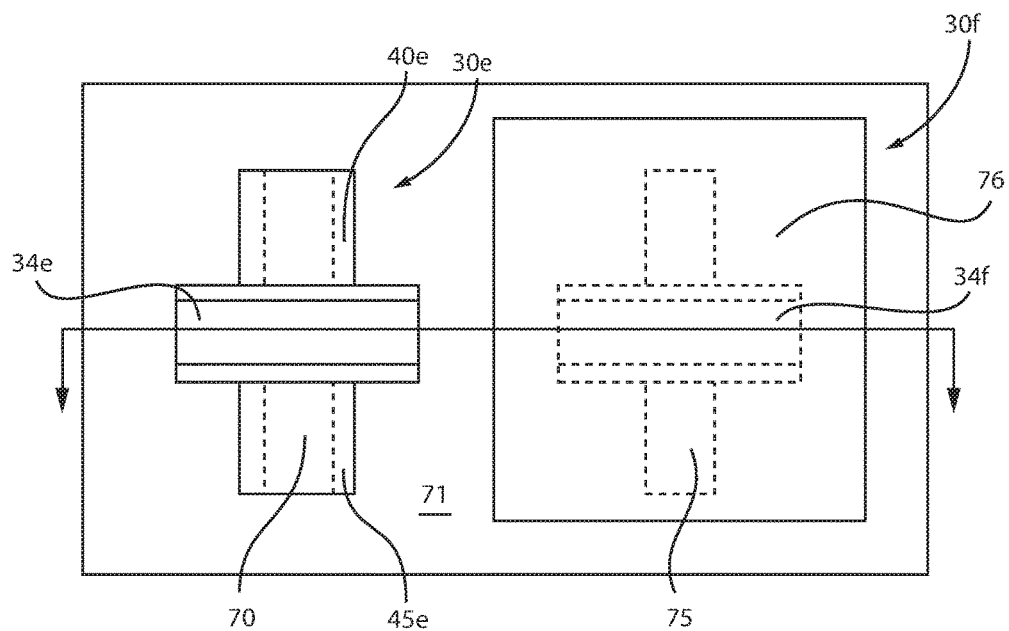
FIG. 11 is a top down view depicting forming a block mask over the first fin structure after patterning the gate structures, and forming source and drain regions on the second fin structure, in accordance with one embodiment of the present disclosure.

FIG. 11 depicts forming a block mask 76 over the first fin structure 70 after patterning the gate structures 30a, 30b, and forming source and drain regions 40f, 45f on the second fin structure 75. In some embodiments, forming the source and drain regions 40f, 45f includes forming in-situ doped semiconductor material on the sidewalls of the fin structure 75 that are exposed. In one embodiment, in-situ doped semiconductor material is formed using an epitaxial growth process. The in-situ doped semiconductor material that is formed on the source and drain portions of the second fin structure 75 are doped with a p-type conductivity dopant. By "in-situ" it is meant that the dopant that dictates the conductivity type of the epitaxially formed material is introduced during the epitaxial deposition process. Dopants suitable for providing an n-type conductivity have been described above with reference to FIG. 4. Following the formation of the in-situ doped epitaxial semiconductor material on the second fin structure 75, the block mask 76 may be removed. Another block mask is then formed over the second fin structure 75, leaving the first fin structure 70 exposed. In-situ doped semiconductor material having an n-type conductivity dopant may then formed on the source and drain portions of the first fin structure 70 to provide the structure depicted in FIGS. 9A and 9B. In some embodiments, an annealing step may diffuse dopant from the in-situ doped semiconductor material to form dopant extension regions in the first and second fin structures 70, 75.

Figure 12:
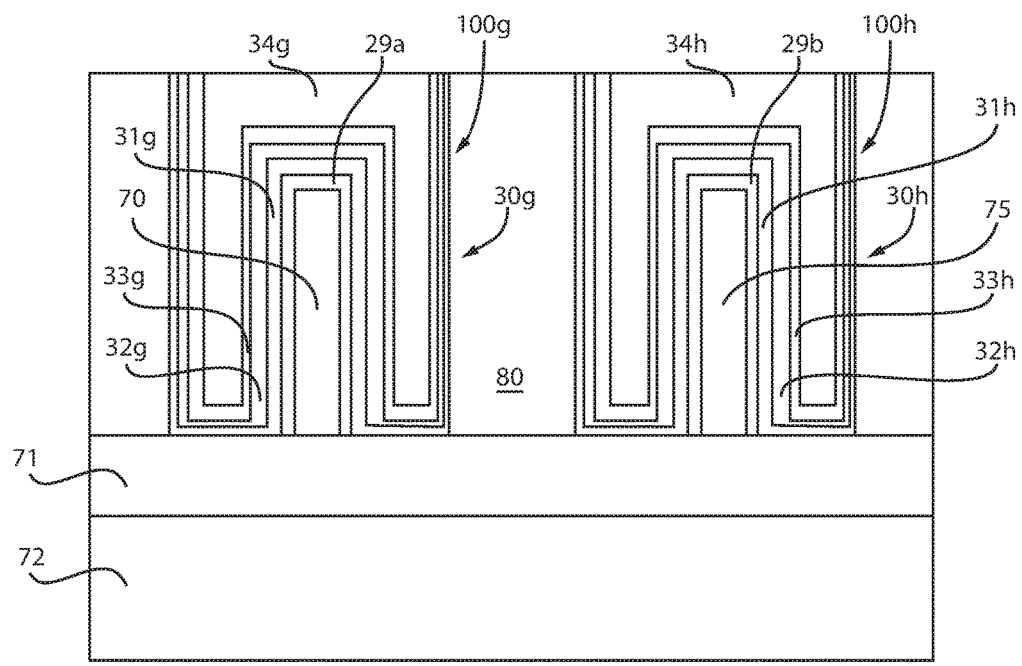
FIG. 12 is a side cross-sectional view depicting an n-type fin field effect transistor (n-FinFET) on a first portion of a substrate composed of a type III-V semiconductor material, and a p-type fin field effect transistor (p-FinFET) on a second portion of the substrate composed of a germanium containing material, in which the n-type and p-type fin field effect transistors (FinFETs) include work function adjustments and are formed using gate last methods, in accordance with one embodiment of the present disclosure.

FIG. 12 depicts one embodiment of an n-type fin field effect transistor (n-FinFET) 100g on a first fin structure 70 composed of a type III-V semiconductor material, and a p-type fin field effect transistor (p-FinFET) 100h on a second fin structure 75 composed of a germanium containing material, in which the n-type and p-type fin field effect transistors (FinFETs) 100g, 100h include work function adjustments and are formed using gate last methods. Similar to the embodiments described with reference to FIGS. 9A-11, each fin structure 70, 75 depicted in FIG. 12 houses the channel region of the semiconductor device. The description of the first and second fin structures 70, 75 illustrated in FIGS. 9A and 9B is suitable for the description of the first and second fin structures 70, 75 depicted in FIG. 12. For example, the type III-V semiconductor material of the first fin structure 70 may be $In_{0.53}Ga_{0.47}As$, and the germanium containing semiconductor material for the second fin structure 75 may be silicon germanium (SiGe), in which the germanium (Ge) concentration is greater than 50 at. %. The dielectric layer 71 and the supporting substrate have also been described above with reference to FIGS. 9A and 9B.

For finFETs that are formed using gate last processing, a silicon containing conformal layer 29a, 29b may be present on each of the first and second fin structures 70, 75. The silicon containing conformal layers 29a, 29b may be composed of amorphous silicon. In some embodiments, when using gate last processing, the silicon containing conformal layer 29b may be omitted from the nFinFET, so that the sole silicon containing conformal layer 29a is present on the pFinFET. The silicon containing conformal layers 29a, 29b may be formed using chemical vapor deposition.

The n-type fin field effect transistor 100g may include a first gate structure 30g that includes a first interface dielectric layer 31g formed on the channel region of the first fin structure 70; a first high-k gate dielectric layer 32g that is present on the first interface dielectric layer 31g; a first metal work function adjusting layer 33g that is present on the first high-k gate dielectric layer 32g; and a first conductive electrode 34g.

The first interface dielectric layer 31g may be an oxide, such as silicon oxide ($SiO_2$). In some embodiments, the first dielectric layers 31g may also be provided by a doped dielectric material deposited by Atomic Layer Deposition (ALD). For example, the first interface dielectric layer 31g may be composed of an aluminum containing dielectric. For example, the aluminum containing dielectric that provides the first interface dielectric layer 31g may be composed of aluminum oxide ($Al_2O_3$), aluminum oxynitride, as well as other aluminum containing dielectrics. The first interface dielectric layer 31g may be present on the sidewalls surfaces and upper surface of the portion of the first fin structure 70 that contains the channel region of the device. In some examples, the thickness of the first interface dielectric layer 31g may be on the order of 1 Å to 10 Å. The first high-k dielectric layer 32g is similar to the first high-k dielectric layer 32a depicted in FIG. 1, and the first high-k dielectric layer 32e that is depicted in FIG. 9A. Therefore, the above description of the first high-k dielectric layer 32a, 32e provided above is suitable for the description of the first high-k dielectric layer 32g that is depicted in FIG. 12.

The first metal work function adjusting layer 33g that is depicted in FIG. 12 is composed of a metal nitride layer, such as titanium nitride deposited by ALD. Although titanium nitride (TiN) is described above as an embodiment of a material suitable for the first metal work function adjusting layers 33g, other metal nitrides may be suitable for use with the present disclosure. For example, the first and second metal work function adjusting layers may include other metals from Groups IVB to VIB in the Periodic Table, including, e.g., tantalum nitride (TaN), niobium nitride (NbN), vanadium nitride (VN), tungsten nitride (WN), and the like with a thickness of about 30 Angstroms to about 60 Angstroms.

The first conductive electrode 34g is similar to the first conductive electrode 34a depicted in FIG. 1, and the first conductive electrode 34g that is depicted in FIG. 9A. Therefore, the above description of the first conductive electrode 34a, 34e provided above is suitable for the description of the first conductive electrode 34g that is depicted in FIG. 12.

The p-type fin field effect transistor 100h may include a second gate structure 30h that includes a second interface dielectric layer 31h formed on the channel portion of the second fin structure 75; a second high-k gate dielectric layer 32h that is present on the second interface dielectric layer 31*h*; a second metal work function adjusting layer 33*h* that is present on the second high-k gate dielectric layer 32*h*; and a second conductive electrode 34*h*.

The second interface dielectric layer 31*h* may be amorphous silicon (Si) doped with a dopant selected from Group IIA or Group IIIB of the Periodic Table of Elements that is integrated into the second interface dielectric layer 31*f*. Examples of dielectric dopants from Group IIA or Group IIIB of the Periodic Table of Elements may be selected from the group consisting of beryllium (Be), magnesium (Mg), barium (Ba), lanthanum (La), yttrium (Y) and combinations thereof. For example, the second interface dielectric layer 31*h* may be composed of a chemical vapor deposited layer of silicon that is conformally deposited, upon which another layer is deposited by ALD and comprises dopants introduced by dopant gas including Group IIA or Group IIIB elements. In some examples, the thickness of the second interface dielectric layer 31*h* may be on the order of 1 Å to 2 nm. The second interface dielectric layer 31*g* may be present on the sidewalls surfaces and upper surface of the portion of the first fin structure 70 that contains the channel region of the device.

The second high-k dielectric layer 32*h* is similar to the second high-k dielectric layer 32*b* depicted in FIG. 1, and the first high-k dielectric layer 32*f* that is depicted in FIG. 9A. Therefore, the above description of the second high-k dielectric layer 32*b*, 32*f* provided above is suitable for the description of the second high-k dielectric layer 32*g* that is depicted in FIG. 12.

The second metal work function adjusting layer 33*h* that is depicted in FIG. 12 may be composed of at least one aluminum (Al) containing layer. For example, the second metal work function adjusting layer 33*h* may be composed of a first layer of titanium nitride (TiN) that is present on the second high-k dielectric layer 32*h*, a second layer of titanium aluminum carbide (TiAlC) that is present on the first layer of titanium nitride (TiN), and a third layer of titanium nitride (TiN) that is present on the second layer of titanium aluminum carbide (TiAlC). In another example, the second metal work function adjusting layer 33*h* may be composed of a first layer of titanium nitride (TiN) that is present on the second high-k dielectric layer 32*h*, a second layer of titanium aluminide (TiAl) that is present on the first layer of titanium nitride (TiN), and a third layer of titanium nitride (TiN) that is present on the second layer of titanium aluminide (TiAl). The thickness of each layer in the composite layer that provides the second metal work function adjusting layer may range from about 10 Angstroms to about 60 Angstroms.

The second conductive electrode 34*h* is similar to the second conductive electrode 34*b* depicted in FIG. 1, and the second conductive electrode 34*f* that is depicted in FIG. 9A. Therefore, the above description of the second conductive electrode 34*a*, 34*f* provided above is suitable for the description of the first conductive electrode 34*h* that is depicted in FIG. 12.

The dual metal, i.e., different compositions for the first metal work function adjusting layer 33*g* and the second metal work function adjusting layer 33*h*, enables a different oxygen vacancy concentration between the n-type finFET 100*g* and the p-type finFET 100*h*. For example, the p-type finFET 100*h* will typically have a gate structure with a high oxygen vacancy concentration and the n-type finFET 100*g* will typically have a gate structure with a low vacancy concentration. As used herein, the term "low concentration" when describing a oxygen vacancy concentration means a concentration of $10^{14}/cm^2$ or below. As used herein, the term "high concentration" when describing a oxygen vacancy concentration means For example, the oxygen vacancy concentration of the p-type finFET 100*h* may range from $10^{14}/cm^2$ to $6 \times 10^{14}/cm^2$, while the oxygen vacancy concentration in the n-type finFET 100*g* may range from $10^{13}/cm^2$ to $6 \times 10^{13}/cm^2$. By providing a p-type FinFET 100*h* including a gate structure 30*h* having a high concentration of oxygen vacancies, the present disclosure provides an effective work function shift towards the conduction band. By providing an n-type FinFET 100*g* including a gate structure 30*g* having a low concentration of oxygen vacancies, the present disclosure provides an effective work function shift towards the valence band The first and second gate structures 30*e*, 30*f* is suitable for use in a replacement metal gate (RMG) process with temperatures reaching approximately 400° C. In a replacement gate process flow, i.e., gate last process flow, the electrodes are not chemically or thermally stable for temperatures greater than 400° C., and can lead to unwanted threshold voltage shifts.

The n-type fin field effect transistor 100*g* includes n-type source regions and n-type drain regions, and the p-type fin field effect transistor 100*h* includes p-type source regions and p-type drain regions. The description of the n-type source regions 40*e* and n-type drain regions 45*e*, the p-type source regions 40*f* and the p-type drain regions 45*f* depicted in FIG. 9B are suitable to describe the source and drain regions of the n-type fin field effect transistor 100*g* and the p-type fin field effect transistor 100*h*.

Still referring to FIG. 12, an interlevel dielectric layer 80 is present overlying the source and drain regions and has an upper surface that is coplanar with an upper surface of the first and second gate structures 30*g*, 30*h*. As will be described below, the interlevel dielectric 80 is formed prior to removing a replacement gate structure, also referred to as sacrificial gate structure. The first and second gate structures 30*g*, 30*h* are formed after the replacement gate structures are removed, and the geometry of the material layers of the gate structure including portions extending along the sidewalls of the interlevel dielectric layer 80 indicative of the gate last methodology.

In one example, an n-type finFET 100*g* formed using a gate last process including a first gate structure 30*g* composed of a first conductive electrode 34*g* of tungsten (W), a first metal work function layer 33*g* of a single metal layer atomic layer deposited (ALD) titanium nitride (TiN), a first high-k gate dielectric layer 32*g* of hafnium oxide (HfO$_2$), and an interface layer 31*e* of silicon oxide (SiO$_2$), which is present on a first fin structure 70 that is composed of In$_{0.53}$Ga$_{0.47}$As can provide an effective work function of approximately 4.6 eV with a 100 to 200 mV nFET shift. In some examples, the 100 to 200 mV nFET shift is to a value greater than 4.6 eV. In the same example, the second gate structure 30*h* of the p-type FinFET semiconductor device 100*h* that is present on the same substrate 10 as the n-type FinFET semiconductor device 100*g* may include a second conductive electrode 34*h* of tungsten (W), a second metal work function layer 33*h* that is a composed of a single metal layer atomic layer deposited (ALD) titanium nitride (TiN), a second high-k gate dielectric layer 32*h* of hafnium oxide (HfO$_2$), and an interface layer 31*h* of amorphous silicon (a-Si) doped with group IIA or group IIIB dopant of the periodic table of elements, in which the second gate structure 30*h* is present on a second fin structure 75 composed of silicon germanium (SiGe) having a germanium (Ge) concentration that is greater than 50 at. %; the effective work function for the p-type finFET 100*h* may be approximately 4.6 eV with a 300 mV to 400 mV shift. For example, the effective work function shift may be 300 mV to 400 mV less than 4.6 eV.

The CMOS device depicted in FIG. 12 may be formed using a gate last process that is described with reference to FIGS. 13-15. In one embodiment, an effective work function for the n-type FinFET 100g ranges from 4.7 to 4.8 eV, and an effective work function of the p-type FinFET 100h ranges from 4.15 eV to 4.25 eV.

Figure 13:
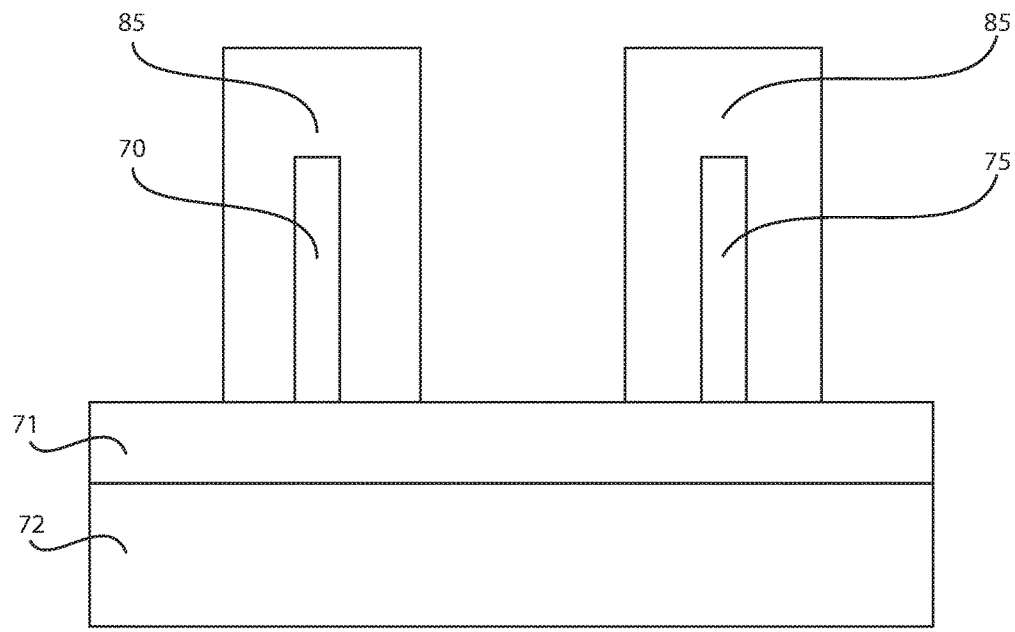
FIG. 13 is a side cross-sectional view depicting forming replacement gate structures on the first and second fin structures, in accordance with one embodiment of the present disclosure.

FIG. 13 depicts forming replacement gate structures 85 on the first and second fin structures 70, 75. Forming replacement gate structures 60 has been described above with reference to the planar CMOS devices depicted in FIG. 6. The above description of forming replacement gate structures 60 on planar CMOS devices is suitable for describing the replacement gate structures 85 on the fin structures 70, 85

Figure 14:
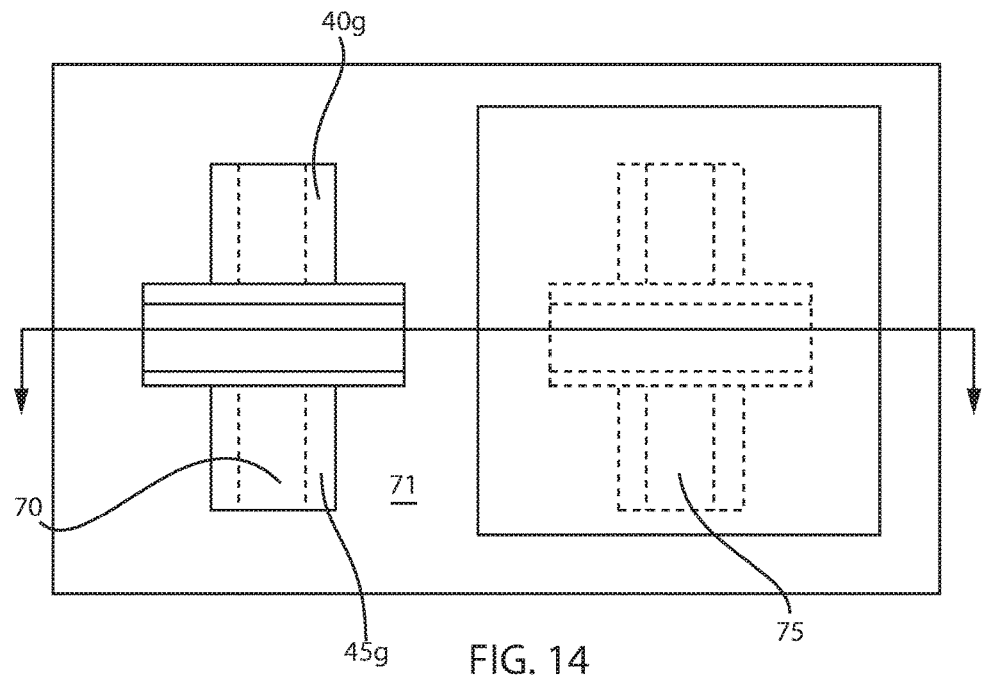
FIG. 14 is a top down view depicting forming p-type source and drain regions on the first fin structure depicted in FIG. 14, and forming n-type source and drain regions on the second fin structure depicted in FIG. 14, in accordance with one embodiment of the present disclosure.

FIG. 14 is a side cross-sectional view depicting forming n-type source and drain regions 40g, 45g on the first fin structure 70, while a block mask 86 is present over the second fin structure 75. The use of block masks, and forming the source and drain regions for FinFETs on the source and drain region portions of the first and second fin structures 70, 75 have been described above with reference to FIG. 11. Therefore, the description of forming block masks and source and drain regions depicted in FIG. 11 is suitable to describe forming the source and drain regions to the first and second fin structures 70, 75 that are depicted.

Figure 15:
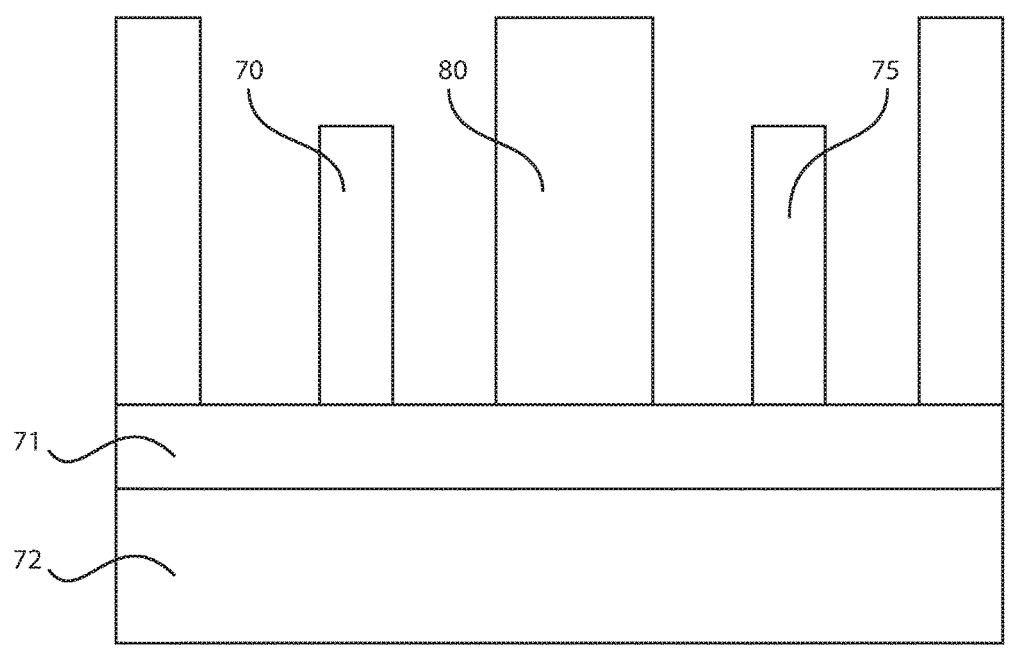
FIG. 15 is a side cross-sectional view depicting forming an interlevel dielectric layer over the structure depicted in FIG. 14, and removing the first and second replacement gate structures, in accordance with one embodiment of the present disclosure.

FIG. 15 is a side cross-sectional view depicting forming an interlevel dielectric layer 80 over the structure depicted in FIG. 14, and removing the replacement gate structures 60. The interlevel dielectric 80 may be formed using a deposition process like chemical vapor deposition (CVD) or spin on deposition, followed by a planarization process, such as chemical mechanical planarization. The replacement gate structures 60 may be removed by a selective etch process to provide a gate opening to each of the first and second fin structures 70, 75.

Referring to FIG. 12, the functional gate structures, i.e., first and second gate structures 30g, 30h, may then be formed in the gate openings. For example, the first and second interface layers 31g, 31h may be formed using a deposition process, such as chemical vapor deposition (CVD) or atomic layer deposition (ALD), or may be formed using a thermal growth process, such as thermal oxidation. Block masks may be used to select the regions in which the first and second interface layers 31g, 31h are formed. The high-k dielectric layer, i.e., first and second high-k dielectric layer 32g, 32h can be formed using chemical vapor deposition (CVD) or atomic layer deposition (ALD). In a following process step, the first and second work function adjusting layers 33g, 33h may be formed. For example, the material layers for the second work function adjusting layer 33h may be deposited into the gate openings to both the first and second fin structures 70, 75. Using block masks and selective etching, the material layers for the second work function adjusting layer 33h may be removed from the gate opening to the first fin structure 70. The first work function adjusting layer 33g may then be formed on the first fin structure 70. The first and second work function adjusting layers 33g, 33h may be deposited using chemical vapor deposition processes, such as plasma enhanced chemical vapor deposition (PECVD), atomic layer deposition (ALD). The first and second gate electrodes 34g, 34h may then be deposited filling the remainder of the openings to the first and second fin structures 70, 75.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. An electrical device comprising:
a first fin structure and a second fin structure of a germanium containing semiconductor material;
an n-type FinFET including a channel region in the first fin structure, the n-type finFET including a n-type work function gate structure including a first interface layer of an aluminum containing dopant at an interface of the channel region, and a first metal work function adjusting layer; and
a p-type FinFET including a channel region in the second fin structure, the p-type finFET including a p-type work function gate structure including a second interface layer including a dopant of a group IIA element, a group IIIB element or a combination thereof at an interface of the channel region, wherein the first interface layer includes oxygen to provide an oxygen source so that the oxygen vacancy concentration in the p-type FinFET is greater than an oxygen vacancy concentration in the n-type FinFET.

2. The electrical device of claim 1, wherein an effective work function for the p-type FinFET is less than an effective work function for the n-type FinFET.

3. The electrical device of claim 1, wherein an effective work function of p-type FinFET is approximately 4.6 eV with a shift towards a valence band ranging from 100 mV to 200 mV.

4. The electrical device of claim 1, wherein an effective work function of the n-type FinFET is approximately 4.6 eV with a shift towards a conduction band ranging from 300 mV to 400 mV.

5. The electrical device of claim 1, wherein the first interface layer comprises aluminum oxide ($Al_2O_3$), the first high-k dielectric layer comprises hafnium oxide ($HfO_2$), the first metal work function adjusting layer comprising a single layer of titanium nitride or a dual layer of titanium nitride and tantalum nitride.

6. The electrical device of claim 5, wherein the n-type work function gate structure comprises a first gate electrode comprises tungsten (W) and the second interface layer comprises lanthanum oxide ($La_2O_3$).

7. The electrical device of claim 6, wherein the p-type work function gate structure comprises a second gate electrode comprises tungsten (W).

8. The electrical device of claim 5, wherein a first gate electrode to the n-type FinFET comprises tungsten (W), and wherein the second interface layer comprises lanthanum oxide ($La_2O_3$), the second high-k dielectric layer comprises hafnium oxide ($HfO_2$), and the second metal work function adjusting layer comprising a dual layer of titanium nitride and tantalum nitride.

9. The electrical device of claim 8, wherein a second gate electrode to the p-type FinFET comprises tungsten (W).

10. The electrical device of claim 1, further comprising an amorphous silicon layer on the first fin structure and the second fin structure.

11. An electrical device comprising;
a first fin structure of a type III-V semiconductor material and a second fin structure of a germanium containing semiconductor material;
an n-type FinFET having a channel region in the first fin structure, the n-type finFET including an n-type work function gate structure including a first high-k gate dielectric layer present on the channel region; and
a p-type FinFET having a channel region in the second fin structure, the p-type finFET having a p-type work function gate structure including a second interface layer including dopant of a group IIA element, group IIIB element or a combination thereof, the interface layer present at an interface of the channel region of the second fin structure and a second high-k dielectric layer, the p-type work function gate structure also including a second metal work function adjusting layer of a stack of titanium and aluminum containing materials that is present atop the second high-k dielectric layer, wherein the interface layer of the p-type FinFET includes oxygen and is present between the second fin structure and the second high-k gate dielectric layer to provide an oxygen source so that the oxygen vacancy concentration in the p-type FinFET is greater than an oxygen vacancy concentration in the n-type FinFET.

12. The electrical device of claim 11, wherein a first gate electrode to the n-type FinFET and a second gate electrode to the P-type FinFET are composed of a same composition.

13. The electrical device of claim 11, wherein the second interface layer is composed of amorphous silicon.

14. The electrical device of claim 13, wherein the dopant of the group IIA element, group IIIB element or the combination thereof comprises lanthanum, yttrium, barium and combinations thereof.

15. The electrical device of claim 11, wherein a first metal work function adjusting layer of the n-type work function gate structure is titanium nitride (TiN).

16. The electrical device of claim 15, wherein the second work function adjusting layer is comprised of a material stack of titanium nitride (TiN), titanium aluminum carbide (TiAlC), and titanium nitride (TiN).

17. The electrical device of claim 11, wherein a first metal work function adjusting layer of the n-type work function gate structure is titanium nitride (TiN), and the second work function adjusting layer is comprised of a material stack of titanium nitride (TiN), titanium aluminide (TiAl), and titanium nitride (TiN).

18. The electrical device of claim 11, wherein an effective work function for the n-type FinFET ranges from 4.7 to 4.8 eV.

19. The electrical device of claim 11, wherein an effective work function of the p-type FinFET ranges from 4.15 eV to 4.25 eV.

20. The electrical device of claim 11, wherein each of the n-type and p-type work function gate structures have a gate electrode of a same composition.

* * * * *